(12) United States Patent
Watanabe et al.

(10) Patent No.: US 9,985,068 B2
(45) Date of Patent: May 29, 2018

(54) SOLID-STATE IMAGING DEVICE AND MANUFACTURING METHOD THEREFOR, AND ELECTRONIC APPARATUS

(71) Applicant: SONY SEMICONDUCTOR SOLUTIONS CORPORATION, Kanagawa (JP)

(72) Inventors: Taiichiro Watanabe, Kanagawa (JP); Fumihiko Koga, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days. days.

(21) Appl. No.: 15/029,717

(22) PCT Filed: Oct. 14, 2014

(86) PCT No.: PCT/JP2014/005203
§ 371 (c)(1),
(2) Date: Apr. 15, 2016

(87) PCT Pub. No.: WO2015/059898
PCT Pub. Date: Apr. 30, 2015

(65) Prior Publication Data
US 2016/0268322 A1  Sep. 15, 2016

(30) Foreign Application Priority Data

Oct. 23, 2013  (JP) ................ 2013-220141

(51) Int. Cl.
*H01L 27/148* (2006.01)
*H01L 27/146* (2006.01)

(52) U.S. Cl.
CPC .... *H01L 27/1464* (2013.01); *H01L 27/14607* (2013.01); *H01L 27/14614* (2013.01); *H01L 27/14641* (2013.01); *H01L 27/14689* (2013.01)

(58) Field of Classification Search
CPC ......... H01L 27/14601; H01L 27/14603; H01L 27/14605; H01L 27/14612;
(Continued)

(56) References Cited

U.S. PATENT DOCUMENTS

2005/0167704 A1* 8/2005 Ezaki ................ H01L 27/14603
257/233
2009/0303371 A1* 12/2009 Watanabe ......... H01L 27/14603
348/311
(Continued)

FOREIGN PATENT DOCUMENTS

JP  2010-016114  1/2010
JP  2010 114273 A  5/2010
(Continued)

OTHER PUBLICATIONS

Official Action (no English translation available) for Japanese Patent Application No. 2013-220141 dated Dec. 27, 2016, 21 pages.
(Continued)

*Primary Examiner* — Brook Kebede
(74) *Attorney, Agent, or Firm* — Sheridan Ross P.C.

(57) ABSTRACT

There is provided a solid state imaging device including a pixel including a photoelectric conversion unit that generates and accumulates a charge according to a received light amount, a charge accumulation unit that accumulates the generated charge, a first transfer transistor that transfers the charge of the photoelectric conversion unit to the charge accumulation unit, a charge holding unit that holds the charge to read out as a signal, and a second transfer transistor that transfers the charge of the charge accumulation unit to the charge holding unit, in which a gate electrode of the first transfer transistor is formed to be buried up to a predetermined depth from a semiconductor substrate interface, and the charge accumulation unit is formed in a longitudinally long shape to be extended in a depth direction along a side (Continued)

wall of the gate electrode of the first transfer transistor to be buried therein.

22 Claims, 20 Drawing Sheets

(58) Field of Classification Search
CPC ......... H01L 27/14614; H01L 27/14638; H01L 27/14643
USPC ................................. 257/228, 233, 292, 431
See application file for complete search history.

(56) References Cited

U.S. PATENT DOCUMENTS

| | | | | |
|---|---|---|---|---|
| 2010/0117126 | A1* | 5/2010 | Takahashi | H01L 27/14609 257/292 |
| 2011/0187911 | A1 | 8/2011 | Shinohara | |
| 2012/0086845 | A1* | 4/2012 | Enomoto | H01L 27/14614 348/311 |
| 2012/0161267 | A1* | 6/2012 | Ezaki | H01L 27/14603 257/431 |
| 2013/0015513 | A1* | 1/2013 | Kido | H01L 27/1461 257/292 |
| 2013/0307040 | A1* | 11/2013 | Ahn | H01L 27/1463 257/292 |

FOREIGN PATENT DOCUMENTS

| | | |
|---|---|---|
| JP | 2011-029453 | 2/2011 |
| JP | 2011-082330 | 4/2011 |
| JP | 2012-084610 | 4/2012 |
| JP | 2013-098446 | 5/2013 |
| WO | WO 2013/088983 A1 | 6/2013 |

OTHER PUBLICATIONS

International Search Report and Written Opinion prepared by the European Patent Office dated Jan. 12, 2015, for International Application No. PCT/JP2014/005203.

\* cited by examiner

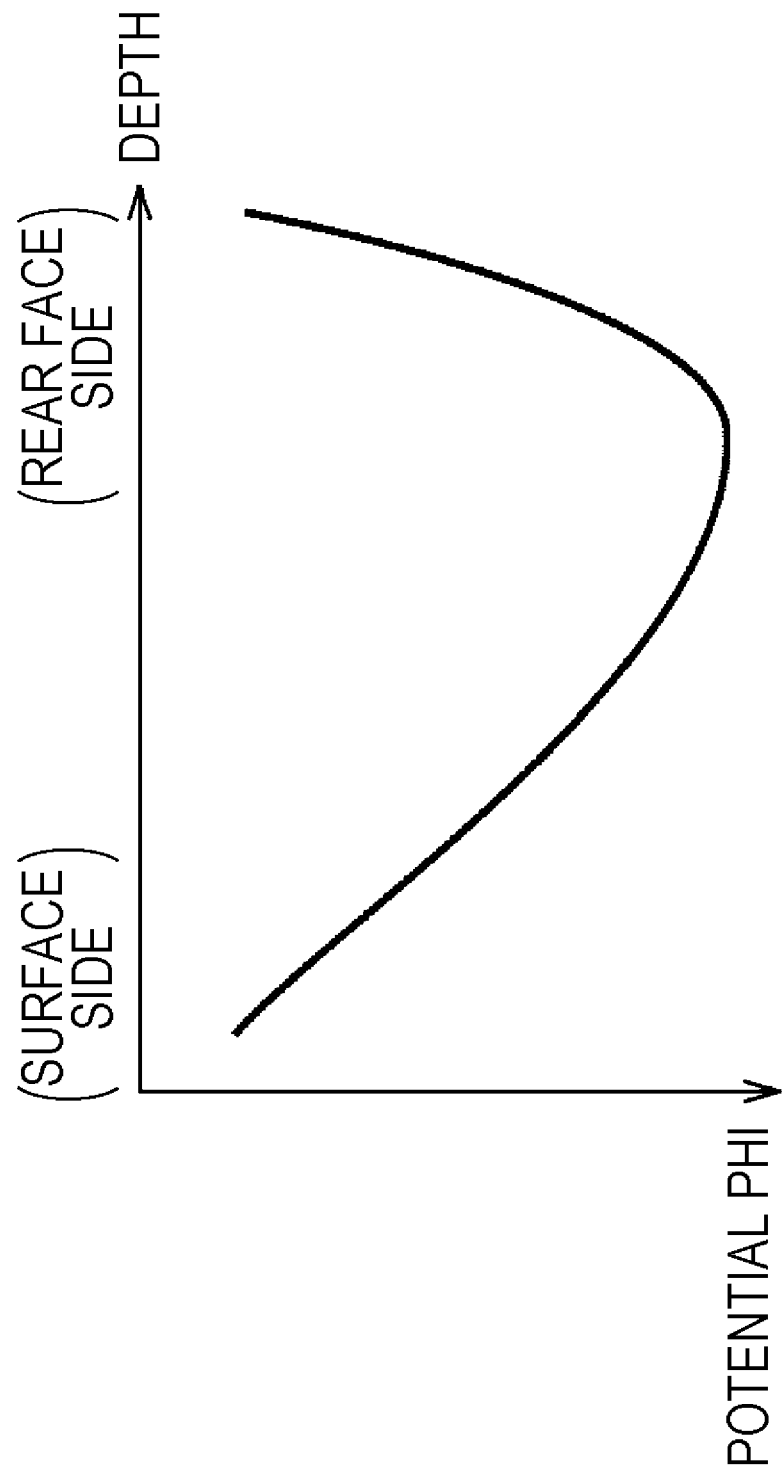

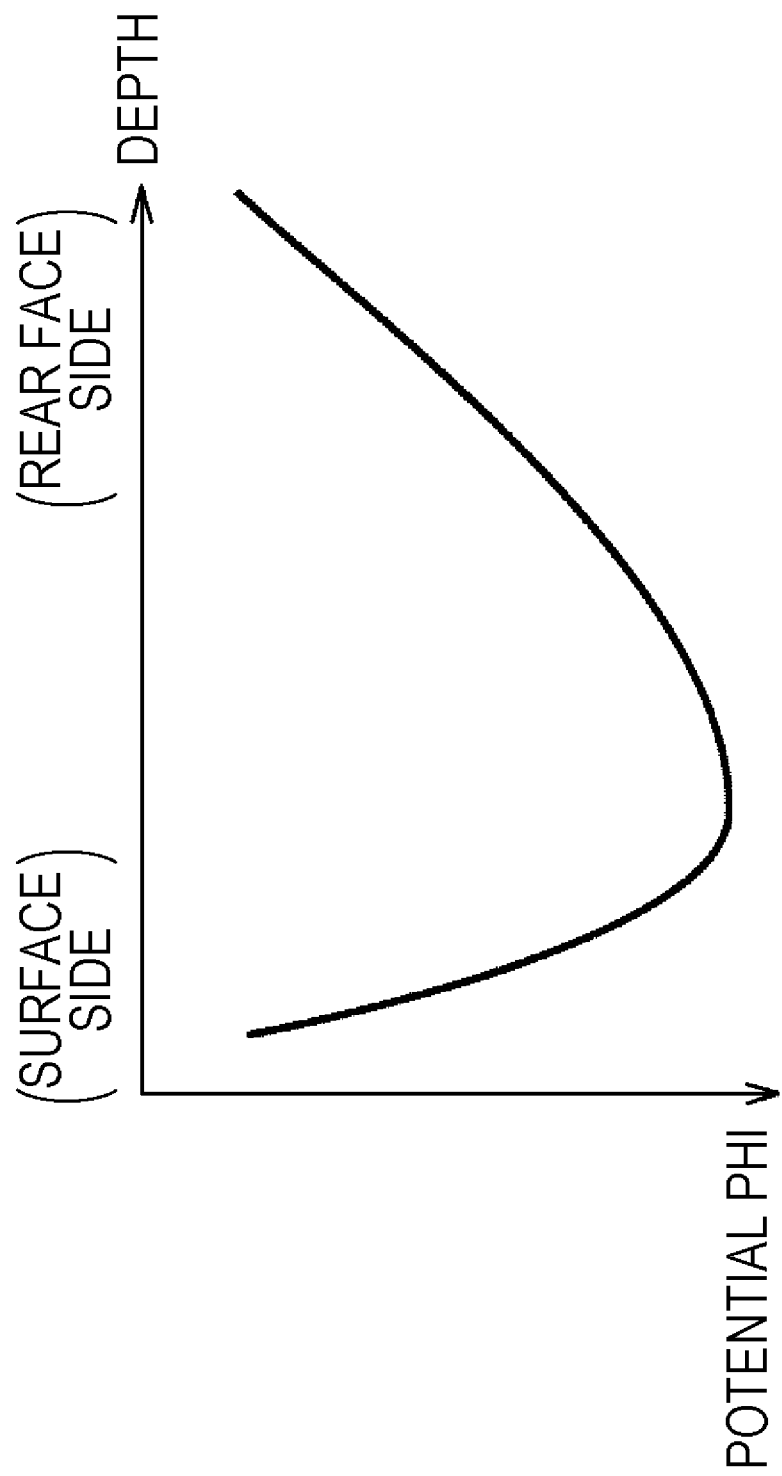

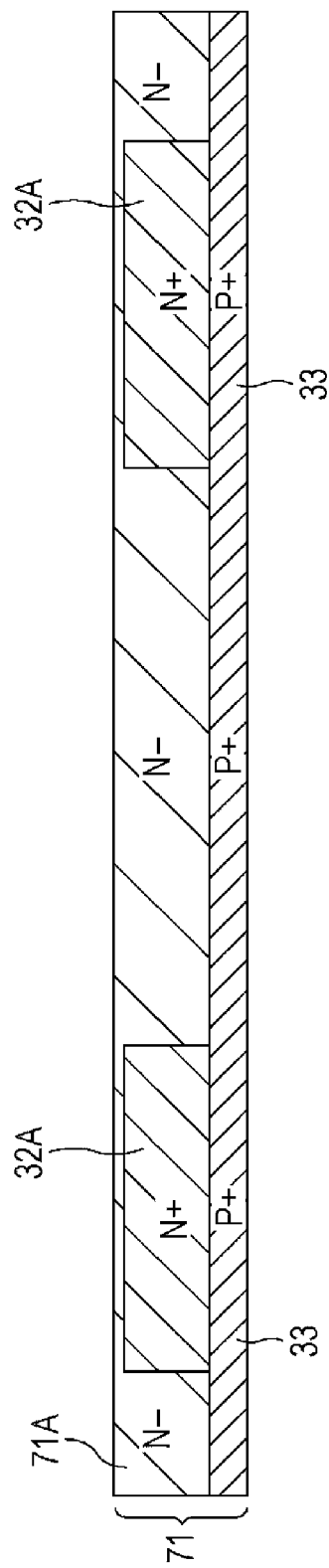

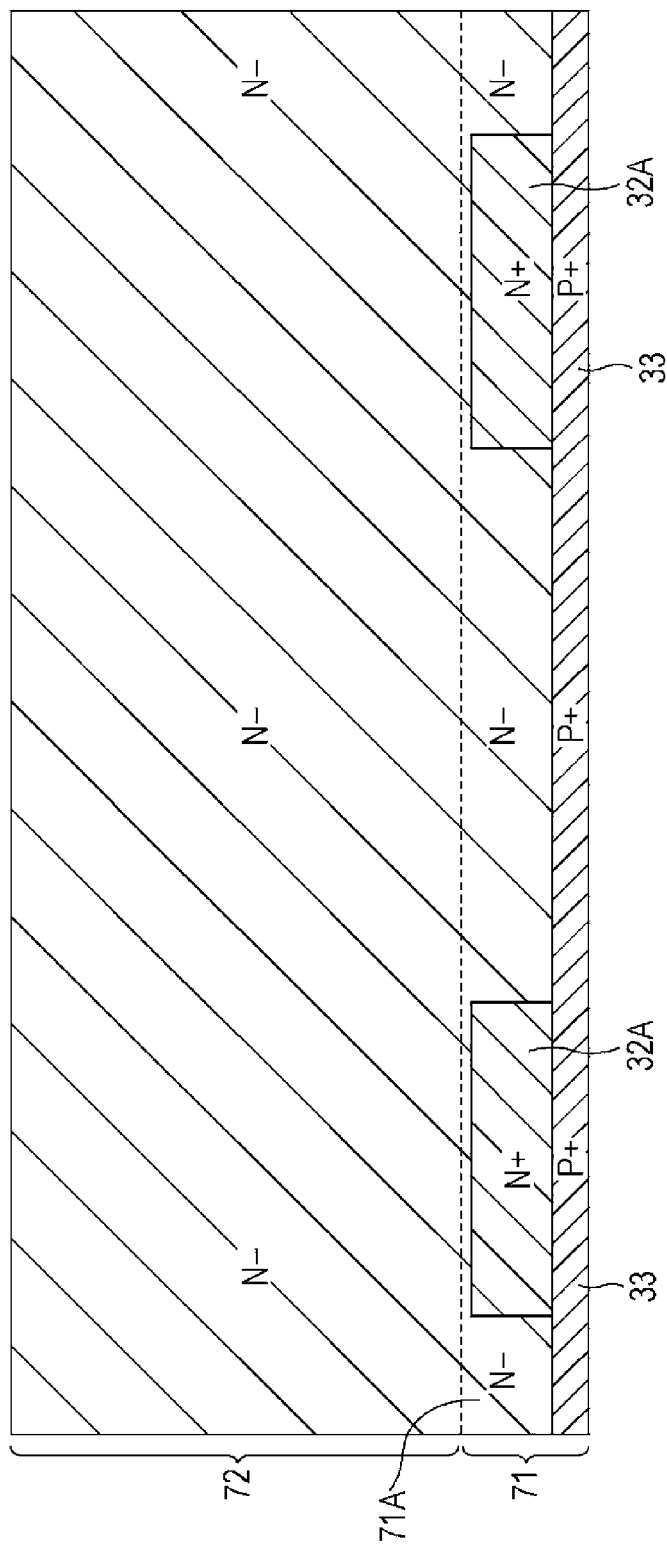

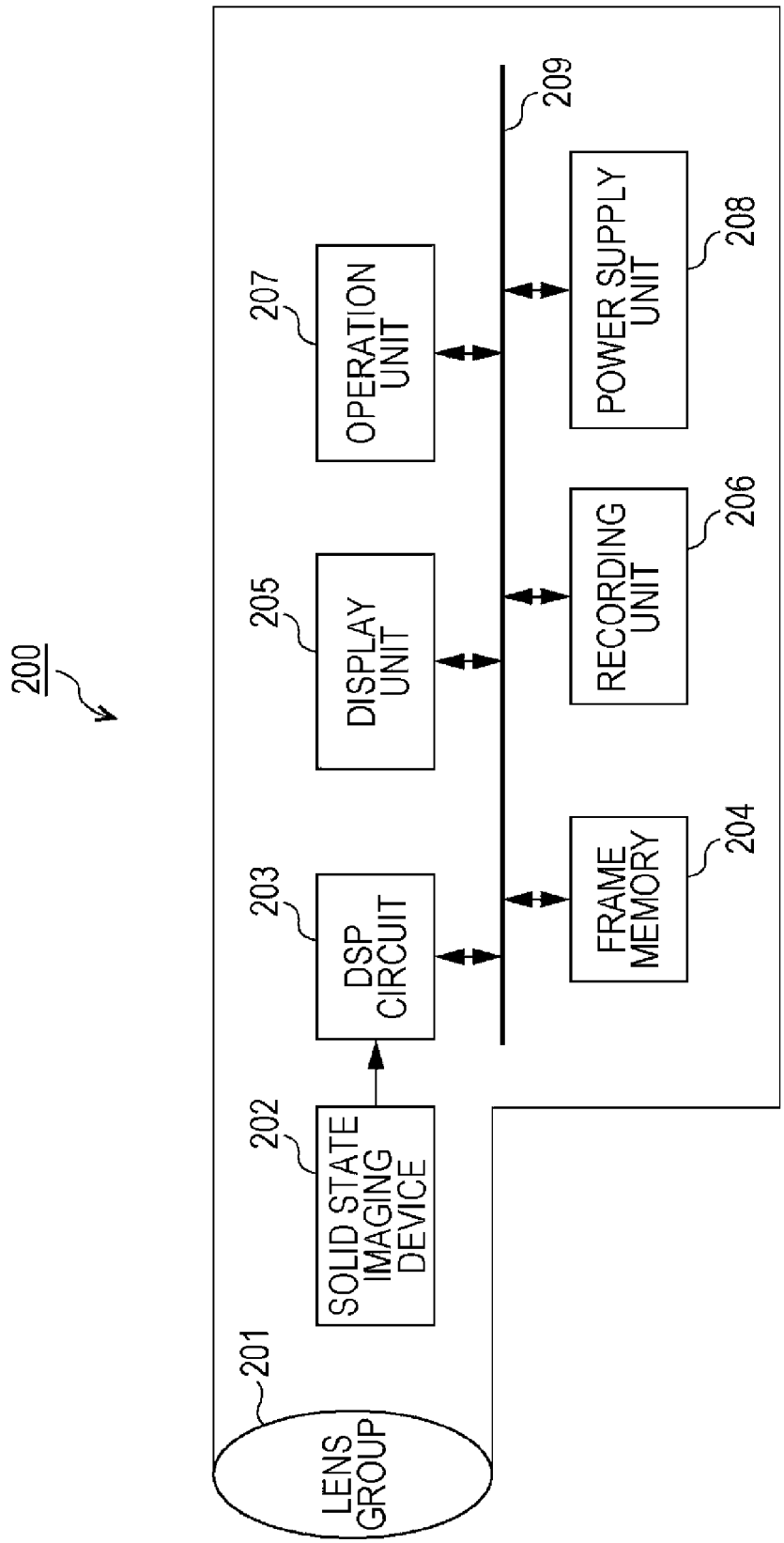

SOLID-STATE IMAGING DEVICE AND MANUFACTURING METHOD THEREFOR, AND ELECTRONIC APPARATUS

CROSS REFERENCE TO RELATED APPLICATIONS

This application is a national stage application under 35 U.S.C. 371 and claims the benefit of PCT Application No. PCT/JP2014/005203 having an international filing date of 14 Oct. 2014, which designated the United States, which PCT application claimed the benefit of Japanese Patent Application No. 2013-220141 filed 23 Oct. 2013, the disclosures of which are incorporated herein by reference in their entirety

TECHNICAL FIELD

The present technology relates to a solid state imaging device and a manufacturing method therefor, and an electronic apparatus, in particular, to a solid state imaging device and a manufacturing method therefor, and an electronic apparatus which are able to achieve refinement of a pixel and to be applied to a rear surface irradiation type.

BACKGROUND ART

In the related art, in a Complementary Metal Oxide Semiconductor (CMOS) solid state imaging device, a rolling shutter system has been adopted. In the rolling shutter system, since charge which is accumulated in a photodiode (PD) is read out for each row, a deviation occurs in time of accumulating photoelectric charge. Accordingly, a distortion occurs in a subject when the subject is moved or the like. In order to prevent the distortion in the subject, a global shutter function that performs an exposure at the same time in all pixels, is necessary.

Therefore, the CMOS solid state imaging device that realizes the global shutter function is proposed (for example, see PTL 1 and PTL 2). In a global shutter system, the charge which is accumulated in the photodiode is temporarily transferred to a charge accumulation unit (memory) at the same time in all the pixels, and the charge is sequentially read out for each row from the charge accumulation unit to an Floating Diffusion (FD). Here, there is a problem that a false signal is made when light from an outside enters the charge accumulation unit while sequentially reading out the charge to the FD. Therefore, in the technology which is disclosed in PTL 1 and PTL 2, a surface irradiation type in which a distance between the charge accumulation unit and a light shielding film is short is adopted, and a configuration that the charge accumulation unit is sufficiently shielded from the light, is adopted.

However, in the method which is disclosed in PTL 1 and PTL 2, since the photodiode and the memory are formed on the same flat surface, it is difficult to increase an area of the photodiode, and to refine the pixel.

Therefore, a structure which is made so as to realize an expansion in the area of the photodiode or the refinement of the pixel by laminating the charge accumulation unit and the FD in a depth direction, is proposed (for example, see PTL 3).

CITATION LIST

Patent Literature

PTL 1: Japanese Unexamined Patent Application Publication No. 2009-268083

PTL 2: International Publication No. 2008/069141

PTL 3: Japanese Unexamined Patent Application Publication No. 2011-82330

SUMMARY OF INVENTION

Technical Problem

However, the structure which is disclosed in PTL 1 to PTL 3, is a pixel structure of the surface irradiation type, and is difficult to be applied to a rear surface irradiation type.

It is desirable to achieve the refinement of the pixel, and to realize the structure which can be applied to the rear surface irradiation type.

Solution to Problem

According to a first embodiment of the present technology, there is provided a solid state imaging device including a pixel including a photoelectric conversion unit that generates a charge according to an amount of light which is received, and accumulates the charge, a charge accumulation unit that accumulates the charge which is generated by the photoelectric conversion unit, a first transfer transistor that transfers the charge of the photoelectric conversion unit to the charge accumulation unit, a charge holding unit that holds the charge in order to read out the charge as a signal, and a second transfer transistor that transfers the charge of the charge accumulation unit to the charge holding unit, in which a gate electrode of the first transfer transistor is formed to be buried up to a predetermined depth from an interface of a semiconductor substrate, and the charge accumulation unit is formed in a longitudinally long shape to be extended in a depth direction along a side wall of the gate electrode of the first transfer transistor which is buried within the semiconductor substrate.

According to a second embodiment of the present technology, there is provided a method for manufacturing a solid state imaging device, in which when forming a pixel including a photoelectric conversion unit that generates a charge according to an amount of light which is received, and accumulates the charge, a charge accumulation unit that accumulates the charge which is generated by the photoelectric conversion unit, a first transfer transistor that transfers the charge of the photoelectric conversion unit to the charge accumulation unit, a charge holding unit that holds the charge in order to read out the charge as a signal, and a second transfer transistor that transfers the charge of the charge accumulation unit to the charge holding unit, a gate electrode of the first transfer transistor is formed to be buried up to a predetermined depth from an interface of a semiconductor substrate, and the charge accumulation unit is formed in a longitudinally long shape to be extended in a depth direction along a side wall of the gate electrode of the first transfer transistor which is buried within the semiconductor substrate.

According to a third embodiment of the present technology, there is provided an electronic apparatus including a solid state imaging device, in which the solid state imaging device includes a pixel including a photoelectric conversion unit that generates a charge according to an amount of light which is received, and accumulates the charge, a charge accumulation unit that accumulates the charge which is generated by the photoelectric conversion unit, a first transfer transistor that transfers the charge of the photoelectric conversion unit to the charge accumulation unit, a charge holding unit that holds the charge in order to read out the charge as a signal, and a second transfer transistor that transfers the charge of the charge accumulation unit to the charge holding unit, in which a gate electrode of the first transfer transistor is formed to be buried up to a predetermined depth from an interface of a semiconductor substrate, and the charge accumulation unit is formed in a longitudinally long shape to be extended in a depth direction along a side wall of the gate electrode of the first transfer transistor which is buried within the semiconductor substrate.

In the first embodiment to the third embodiment of the present technology, the gate electrode of the first transfer transistor that transfers the charge generated by the photoelectric conversion unit to the charge accumulation unit, is formed to be buried up to the predetermined depth from the interface of the semiconductor substrate, and the charge accumulation unit is formed in the longitudinally long shape to be extended in the depth direction along the side wall of the gate electrode of the first transfer transistor which is buried within the semiconductor substrate.

The solid state imaging device and the electronic apparatus may be independent devices, or may be modules to be incorporated into other devices.

Advantageous Effects of Invention

According to the first embodiment to the third embodiment of the present technology, it is possible to achieve the refinement of the pixel, and to realize the structure which can be applied to the rear surface irradiation type.

Furthermore, effects described herein are not necessarily limited thereto, and any one of the effects described in the present disclosure may be achieved.

BRIEF DESCRIPTION OF DRAWINGS

FIG. 6A is a diagram illustrating a potential of a photodiode and a memory unit in a depth direction of a substrate.

FIG. 6B is a diagram illustrating the potential of the photodiode and the memory unit in the depth direction of the substrate.

FIG. 7 is a diagram describing a method for manufacturing a pixel.

FIG. 8 is a diagram describing the method for manufacturing a pixel.

FIG. 17 is a block diagram illustrating a configuration example of an imaging apparatus as an electronic apparatus to which the present technology is applied.

DESCRIPTION OF EMBODIMENTS

Figure 1:
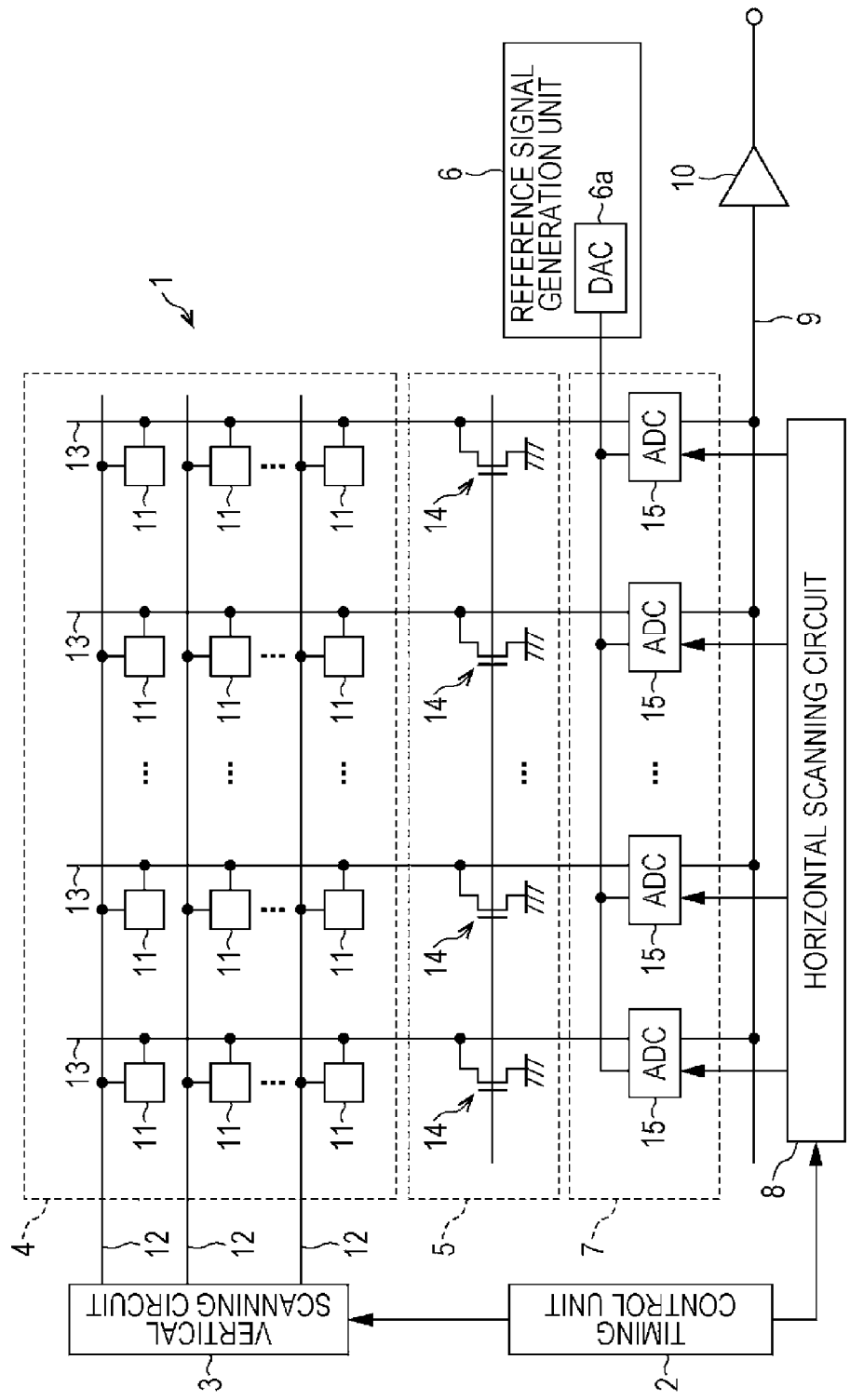
FIG. 1 is a block diagram illustrating an example of a schematic configuration of a solid state imaging device to which the present technology is applied.

Hereinafter, forms for carrying out the present technology (hereinafter, referred to as embodiments) will be described. Furthermore, descriptions thereof are performed in the following order.

1. Example of an overall configuration of a solid state imaging device
2. Example of a circuit configuration of a pixel
3. Pixel structure according to a first embodiment (example of the configuration that a first transfer transistor and a memory unit are longitudinal types and a second transfer transistor is a flat surface type)
4. Plan view of the pixel
5. Features of the pixel
6. Method for manufacturing a pixel
7. Pixel structure according to a second embodiment (example of the configuration that the second transfer transistor is also the longitudinal type)
8. Pixel structure according to a third embodiment (example of the configuration that the first transfer transistor passes through)
9. Pixel structure according to a fourth embodiment (example of the configuration that a depth of the first transfer transistor is deeper than the depth of the second transfer transistor)
10. Configuration example of an electronic apparatus to which the present technology is applied <1. Example of an Overall Configuration of a Solid State Imaging Device>

FIG. 1 is a block diagram illustrating an example of an overall configuration of a solid state imaging device to which the present technology is applied.

A solid state imaging device 1 of FIG. 1 is configured of a timing control unit 2, a vertical scanning circuit 3, a pixel array unit 4, a constant current source circuit 5, a reference signal generation unit 6, a column AD conversion unit 7, a horizontal scanning circuit 8, a horizontal output line 9, and an output circuit 10.

Based on a master clock of a predetermined frequency, the timing control unit 2 supplies a clock signal and a timing signal which are necessary for a predetermined operation, to the vertical scanning circuit 3 and the horizontal scanning circuit 8. For example, the timing control unit 2 supplies the timing signal for a shutter operation and a readout operation of a pixel 11, to the vertical scanning circuit 3 and the horizontal scanning circuit 8. Furthermore, an illustration thereof is omitted, but the timing control unit 2 supplies the clock signal and the timing signal which are necessary for the predetermined operation, to the reference signal generation unit 6 and the column AD conversion unit 7 or the like.

The vertical scanning circuit 3 sequentially supplies a signal which controls an output of a pixel signal, to each pixel 11 which is lined up in a vertical direction of the pixel array unit 4, at a predetermined timing.

In the pixel array unit 4, a plurality of the pixels 11 are arranged in a two-dimensional array shape (row and column shape).

The plurality of the pixels 11 which are arranged in the two-dimensional array shape, are connected to the vertical scanning circuit 3 by a row unit, by a horizontal signal line 12. In other words, the plurality of the pixels 11 which are arranged in the same row within the pixel array unit 4, are connected to the vertical scanning circuit 3, with one horizontal signal line 12. In FIG. 1, the horizontal signal line 12 is shown as one wiring, but is not limited to one.

Furthermore, the plurality of the pixels 11 which are arranged in the two-dimensional array shape, are connected to the horizontal scanning circuit 8 by a column unit, by a vertical signal line 13. In other words, the plurality of the pixels 11 which are arranged in the same column within the pixel array unit 4, are connected to the horizontal scanning circuit 8, with one vertical signal line 13.

In accordance with the signal which is supplied from the vertical scanning circuit 3 through the horizontal signal line 12, each pixel 11 within the pixel array unit 4 outputs the pixel signal according to a charge which is accumulated therein, to the vertical signal line 13. A detailed circuit configuration of the pixel 11 will be described later with reference to FIG. 2.

The constant current source circuit 5 includes a plurality of load MOSs 14, and one load MOS 14 is connected to one vertical signal line 13. A bias voltage is applied to a gate of the load MOS 14, and a source is grounded. The load MOS 14 configures a transistor and a source follower circuit within the pixel 11 which is connected through the vertical signal line 13.

The reference signal generation unit 6 is configured to include a Digital to Analog Converter (DAC) 6a, generates a reference signal of a ramp (RAMP) waveform, and supplies the reference signal to the column AD conversion unit 7, according to the clock signal from the timing control unit 2.

A plurality of Analog-Digital Converters (ADCs) 15 which are made one by one for each column of the pixel array unit 4, are included in the column AD conversion unit 7. Therefore, the plurality of the pixels 11, one load MOS 14, and one ADC 15 are connected to one vertical signal line 13.

The ADC 15 performs a Correlated Double Sampling; correlative double sampling (CDS) process of the pixel signal which is supplied through the vertical signal line 13 from the pixel 11 of the same column, and further performs an AD conversion process.

Each ADC 15 temporarily stores pixel data after the AD conversion, and outputs the pixel data to the horizontal output line 9, in accordance with a control of the horizontal scanning circuit 8.

The horizontal scanning circuit 8 sequentially outputs the pixel data which is stored in the plurality of the ADCs 15, to the horizontal output line 9, at the predetermined timing.

The horizontal output line 9 is connected to the output circuit (amplifier circuit) 10, and the pixel data which is output from each ADC 15 after the AD conversion, is output to an outside of the solid state imaging device 1 from the output circuit 10 through the horizontal output line 9. For example, there is a case where the output circuit 10 only performs buffering, and there is a case where the output circuit 10 performs various digital signal process such as a black level adjustment and a variation correction in a column.

The solid state imaging device 1 which is configured as described above, is a CMOS image sensor that is called a column AD system in which the ADCs 15 to perform the CDS process and the AD conversion process are arranged for each vertical column.

<2. Example of a Circuit Configuration of a Pixel>

Figure 2:
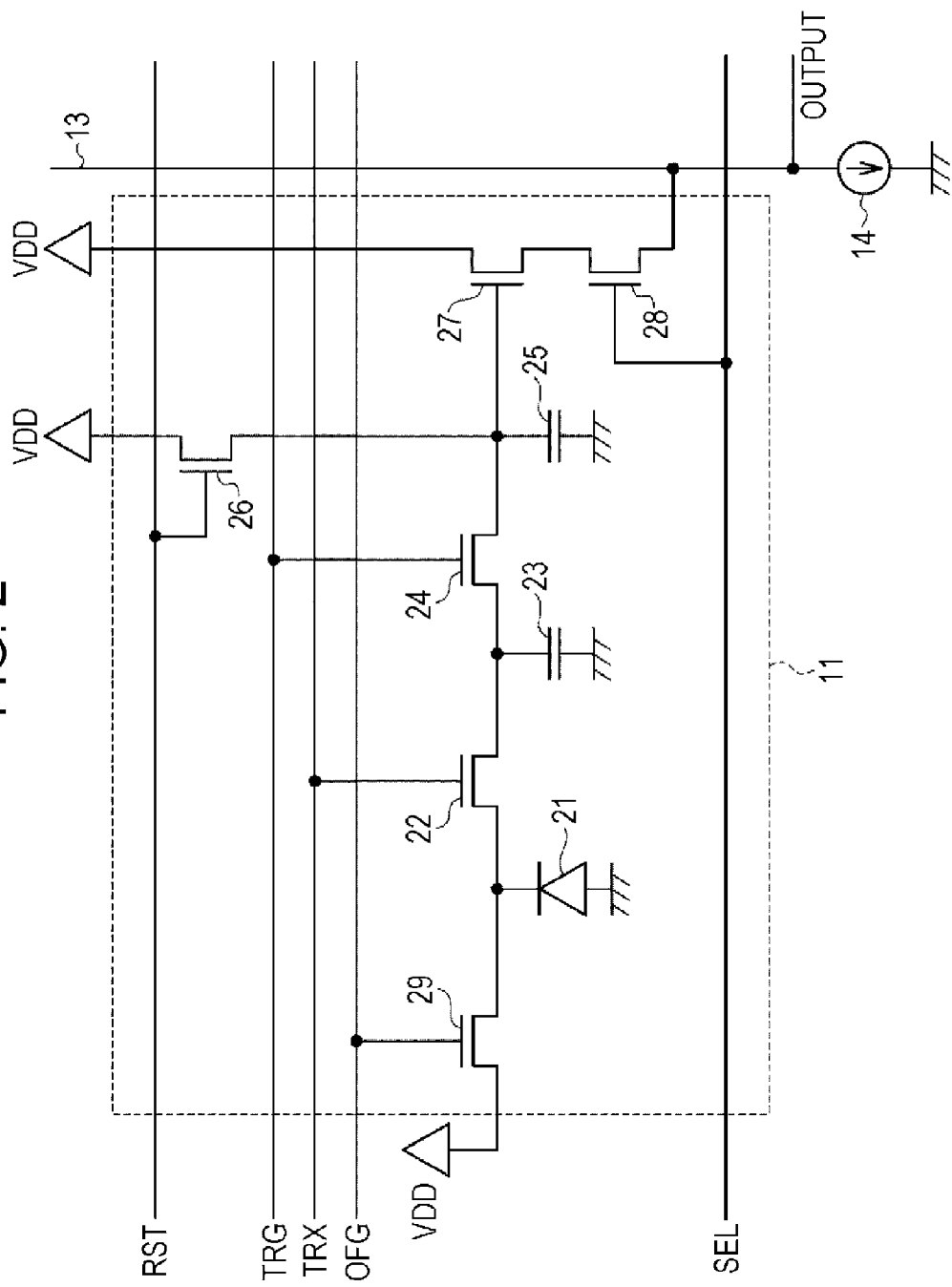
FIG. 2 is a diagram illustrating an equivalent circuit in a pixel of FIG. 1.

FIG. 2 shows an equivalent circuit of the pixel 11.

The pixel 11 includes a photodiode 21 as a photoelectric conversion device, a first transfer transistor 22, a memory unit (MEM) 23, a second transfer transistor 24, a Floating Diffusion (FD) 25, a reset transistor 26, an amplification transistor 27, a selection transistor 28, and a discharge transistor 29.

The photodiode 21 is a photoelectric conversion unit that generates the charge (signal charge) according to an amount of light which is received, and accumulates the charge. An anode terminal of the photodiode 21 is grounded, and a cathode terminal thereof is connected to the memory unit 23 through the first transfer transistor 22. Moreover, the cathode terminal of the photodiode 21 is also connected to the discharge transistor 29.

When the first transfer transistor 22 is turned on by a transfer signal TRX, the first transfer transistor 22 reads out the charge which is generated by the photodiode 21, and transfers the charge to the memory unit 23. While the charge is transferred to the FD 25, the memory unit 23 is a charge accumulation unit that temporarily accumulates the charge. When the second transfer transistor 24 is turned on by a transfer signal TRG, the second transfer transistor 24 transfers the charge which is held in the memory unit 23, to the FD 25.

The FD 25 is a charge holding unit that holds the charge which is read out from the memory unit 23 in order to read out the charge as a signal. When the reset transistor 26 is turned on by a reset signal RST, the charge which is held in the FD 25 is discharged to a constant voltage source VDD, and thereby the reset transistor 26 resets a potential of the FD 25.

The amplification transistor 27 outputs the pixel signal according to the potential of the FD 25. That is, the amplification transistor 27 configures the load MOS 14 as a constant current source, and the source follower circuit, and the pixel signal that shows a level according to the charge which is held in the FD 25, is output to the ADC 15 through the selection transistor 28 from the amplification transistor 27.

When the pixel 11 is selected by a selection signal SEL, the selection transistor 28 is turned on, and outputs the pixel signal of the pixel 11, to the ADC 15 through the vertical signal line 13. When the discharge transistor 29 is turned on by a discharge signal OFG, the discharge transistor 29 discharges the unnecessary charge which is accumulated in the photodiode 21, to the constant voltage source VDD. The transfer signals TRX and TRG, the reset signal RST, the selection signal SEL, and the discharge signal OFG are controlled by the vertical scanning circuit 3, and are supplied through the horizontal signal line 12 (FIG. 1).

The operations of the pixel 11 will be simply described.

First, before an exposure is started, the discharge signal OFG having a High level is supplied to the discharge transistor 29, and thereby the discharge transistor 29 is turned on, the charge which is accumulated in the photodiode 21 is discharged to the constant voltage source VDD, and the photodiode 21 is reset.

After resetting the photodiode 21, the discharge transistor 29 is turned off by the discharge signal OFG having a Low level, and the exposure is started in all pixels.

When a predetermined exposure time which is set in advance passes, in all the pixels of the pixel array unit 4, the first transfer transistor 22 is turned on by the first transfer signal TRX, and the charge which is accumulated in the photodiode 21, is transferred to the memory unit 23.

After the first transfer transistor 22 is turned off, the charge which is held in the memory unit 23 of each pixel 11 is sequentially read out in the ADC 15, by a row unit. As for the readout operation, the second transfer transistors 24 of the pixel 11 in the row which is read out is turned on by the second transfer signal TRG, and the charge which is held in the memory unit 23 is transferred to the FD 25. Therefore, the selection transistor 28 is turned on by the selection signal SEL, and thereby the signal that shows the level according to the charge which is held in the FD 25, is output to the ADC 15 through the selection transistor 28 from the amplification transistor 27.

<3. Pixel Structure According to a First Embodiment>

The pixel 11 can adopt any one of pixel structures which are shown as a first embodiment to a fourth embodiment in the following. First, the pixel 11 according to the first embodiment will be described.

Figure 3:
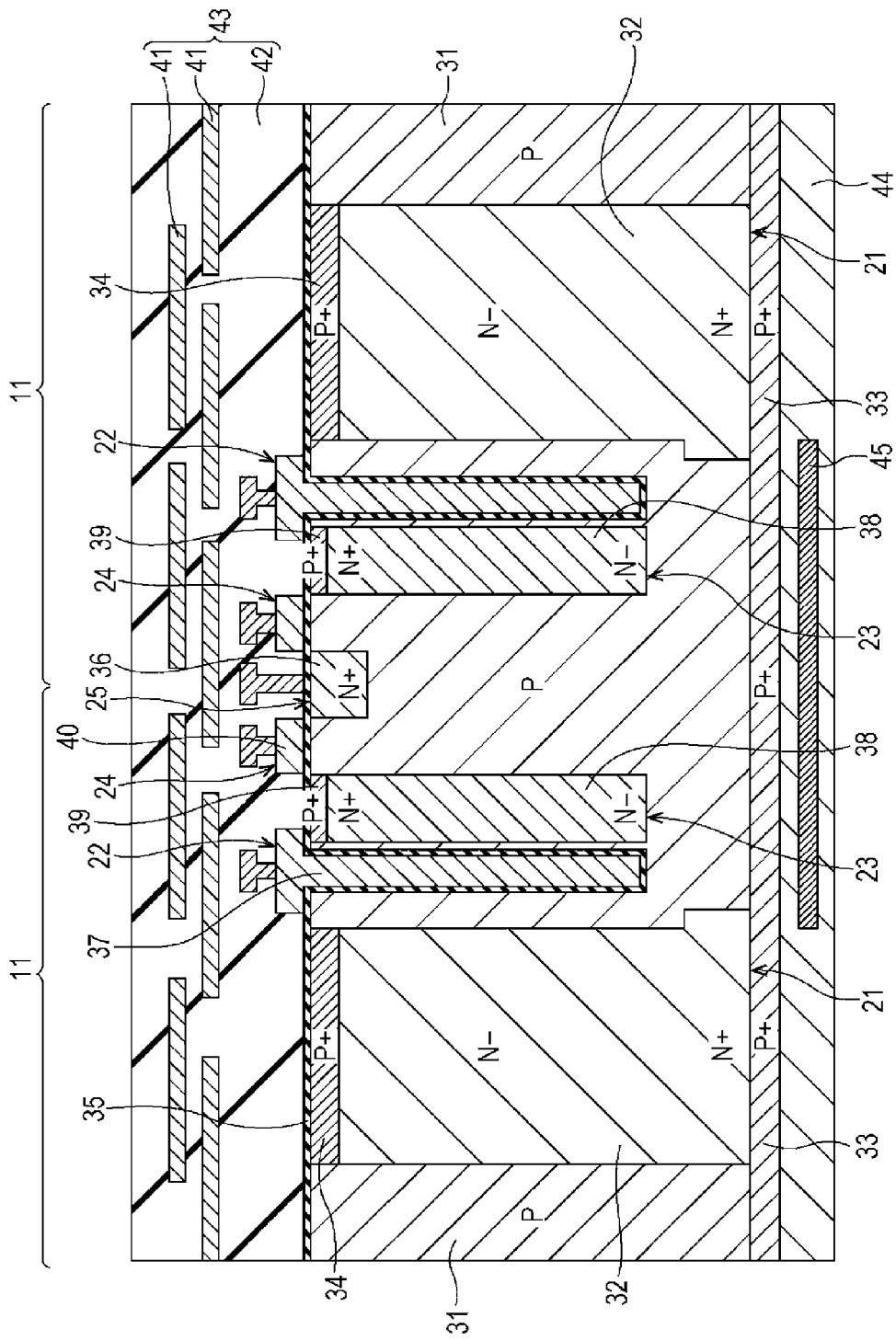
FIG. 3 is a cross-sectional view illustrating a pixel structure according to a first embodiment of the pixel.

FIG. 3 is a cross-sectional view illustrating the pixel structure according to the first embodiment of the pixel 11.

The cross-sectional view of the structure of the pixel 11 which is shown in FIG. 3, is the cross-sectional view in case of sharing the FD 25 with the plurality of the pixels 11, and shows the cross-sectional view of the two adjacent pixels which share the FD 25.

In FIG. 3, a lower side in the drawing is a rear surface side of a semiconductor substrate which is a light incidence side, and an upper side in the drawing corresponds to a surface side of the semiconductor substrate on which a wiring layer is formed. Therefore, the pixel 11 shown in FIG. 3 has the pixel structure of a rear surface irradiation type.

In each pixel 11, for example, within a P-type (first conductivity type) semiconductor region (semiconductor substrate) 31, an N-type (second conductivity type) semiconductor region 32 is formed, and thereby the photodiode 21 is formed.

Within the N-type semiconductor region 32 which is a charge accumulation region of the photodiode 21, the region of the substrate rear surface side (lower side in the drawing) is adjusted to the N-type (N+) semiconductor region having a high concentration, and the region of the substrate surface side (upper side in the drawing) is adjusted to the N-type (N−) semiconductor region having a low concentration.

Furthermore, among a P-type semiconductor region 31, in a vicinity of a rear side surface of the semiconductor substrate, a P-type (P+) semiconductor region 33 of which the concentration is higher than that of an inside region, is formed. Moreover, also on a substrate surface side of the N-type semiconductor region 32, a P-type (P+) semiconductor region 34 having a high concentration is formed.

On an interface of the semiconductor substrate surface side, a gate insulating film 35 is formed by silicon oxide ($SiO_2$) or the like.

On the interface of the substrate surface side of a central portion in the drawing which is a boundary between the adjacent pixels 11, an N-type (N+) semiconductor region 36 having a high concentration which is the FD 25, is formed.

Therefore, between the N-type semiconductor region 32 which is the charge accumulation region of the photodiode 21, and the N-type (N+) semiconductor region 36 having a high concentration which is the FD 25, a gate electrode 37 of the first transfer transistor 22 is formed to be buried up to a predetermined depth from the interface of the substrate surface side. The transistor of which the gate electrode is formed to be buried up to the predetermined depth from the interface of the substrate surface side, is referred to as a longitudinal type transistor.

On the FD 25 side which is opposite to the photodiode 21 side of the gate electrode 37 of the first transfer transistor 22, an N-type semiconductor region 38 which is the memory unit 23 is formed. Accordingly, the memory unit 23 is formed at a distant position from the FD 25 in a flat surface direction. Moreover, within the N-type semiconductor region 38 which is the memory unit 23, the region of the substrate rear surface side is adjusted to the N-type (N−) semiconductor region having a low concentration, and the region of the substrate surface side is adjusted to the N-type (N+) semiconductor region having a high concentration.

A P-type (P+) semiconductor region 39 having a high concentration is formed between the N-type semiconductor region 38 which is the memory unit 23, and the gate insulating film 35.

Furthermore, on the gate insulating film 35 between the N-type semiconductor region 38 which is the memory unit 23, and the N-type (N+) semiconductor region 36 having a high concentration which is the FD 25, a gate electrode 40 of the second transfer transistor 24 is formed.

For example, in the gate electrode 37 of the first transfer transistor 22 and the gate electrode 40 of the second transfer transistor 24, a metal material having a light shielding capability such as tungsten (W) and copper (Cu), is used. Moreover, in the gate electrode 37 and the gate electrode 40, polysilicon (Poly-Si) may be also used.

Therefore, at a top of the gate insulating film 35 including the gate electrode 37 of the first transfer transistor 22 and the gate electrode 40 of the second transfer transistor 24, a multilayer wiring layer 43 which is made up of a plurality of wiring layers 41 and an interlayer insulating film 42, is formed.

On the other hand, on the rear surface side which is the light incidence side of the semiconductor substrate (semiconductor region 31), a flattening film 44 is formed, and a light shielding film 45 is formed on the partial region within the flattening film 44. With respect to the N-type semiconductor region 38 which is the memory unit 23, and the N-type (N+) semiconductor region 36 having a high concentration which is the FD 25, the light shielding film 45 is formed at the position to prevent the incidence of the light.

The illustration thereof is omitted, but a color filter and an on-chip lens are formed on the further lower side (light incidence side) of the flattening film 44.

<4. Plan View of the Pixel>

Figure 4A:
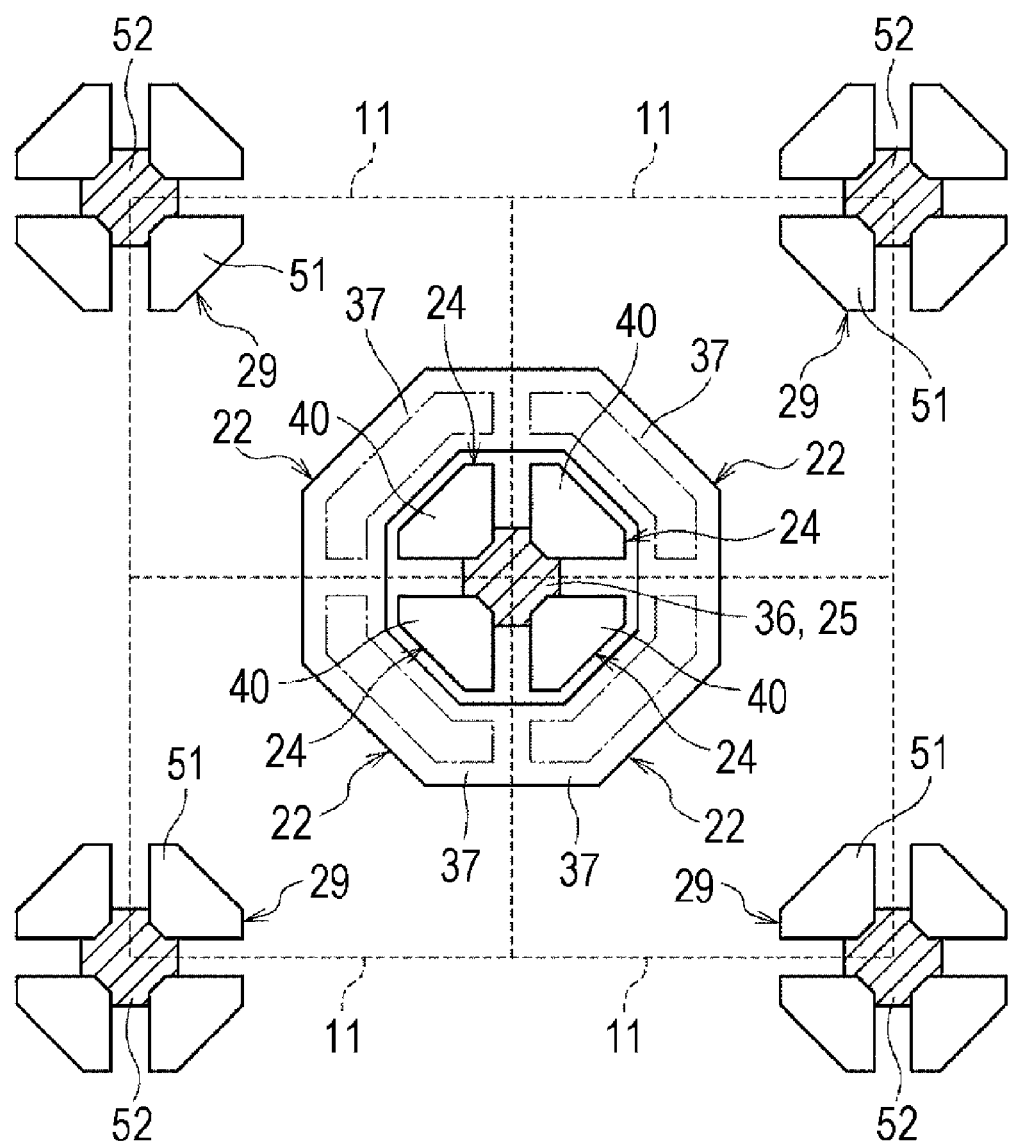
FIG. 4A is a plan view of the four adjacent pixels.

FIG. 4A is a plan view which is taken when seen the four adjacent pixels 11 from the multilayer wiring layer 43 side.

As shown in FIG. 4A, in the central portion of the four pixels 11, the N-type (N+) semiconductor region 36 having a high concentration as the FD 25 is arranged, and the solid state imaging device 1 adopts the configuration of arranging to share the one FD 25 with the four adjacent pixels 11.

Then, the gate electrode 40 of the second transfer transistor 24 and the gate electrode 37 of the first transfer transistor 22 in each of the four pixels 11 which share the one FD 25, are arranged in proximity to the FD 25 in order thereof. Furthermore, in FIG. 4A, a dashed line within the gate electrode 37 of the first transfer transistor 22, shows the region where the gate electrode 37 is buried in the P-type semiconductor region 31.

Moreover, on a corner of an opposite angle to the corner in which the FD 25 of the pixel 11 is arranged to be the region having a rectangular shape, a gate electrode 51 of the discharge transistor 29 for discharging the charge, and an N-type (N+) semiconductor region 52 which is connected to the constant voltage source VDD, are formed.

Figure 4B:
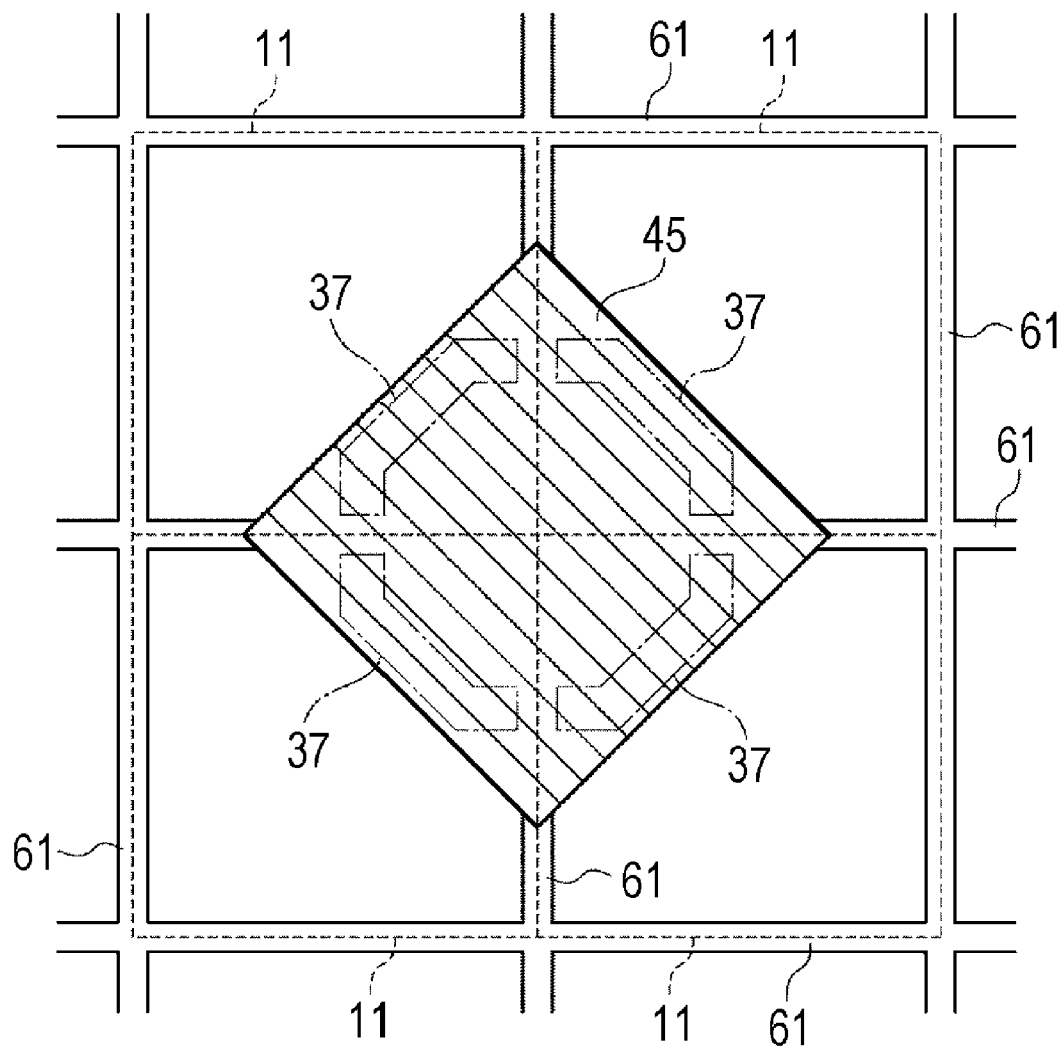
FIG. 4B is a plan view of the four adjacent pixels.

FIG. 4B is a plan view which is taken when seen the flat surface in which the light shielding film 45 of the four adjacent pixels 11 is formed, from the light incidence side.

As shown in FIG. 4B, the light shielding film 45 is formed in a flat surface, up to the outside of the gate electrode 37 of the first transfer transistor 22 which is dug in a depth direction, and thereby it is possible to prevent the incidence of the light in the N-type semiconductor region 38 which is the memory unit 23, and the N-type (N+) semiconductor region 36 having a high concentration which is the FD 25. On the boundary of each pixel 11, an interpixel light shielding film 61 for preventing the incidence of the light from the adjacent pixels 11, is formed of the same material as the light shielding film 45.

As described above, in the pixel 11 of the solid state imaging device 1, the N-type semiconductor region 38 as the memory unit 23, is formed in a longitudinally long shape along a side wall of the gate electrode 37 of the first transfer transistor 22 of the longitudinal type. Hereby, while securing a flat surface region of the photodiode 21 to be greater than the flat surface region of the memory unit 23, it is possible to achieve refinement of the pixel 11. Furthermore, since the gate electrode 37 of the first transfer transistor 22 is formed of the material having a light shielding capability, it is possible to shield the incident light from the photodiode 21.

Hence, according to the present technology, it is possible to achieve the refinement of the pixel 11, and to realize the structure which can be also applied to the rear surface irradiation type.

<5. Features of the Pixel>

Figure 5A:
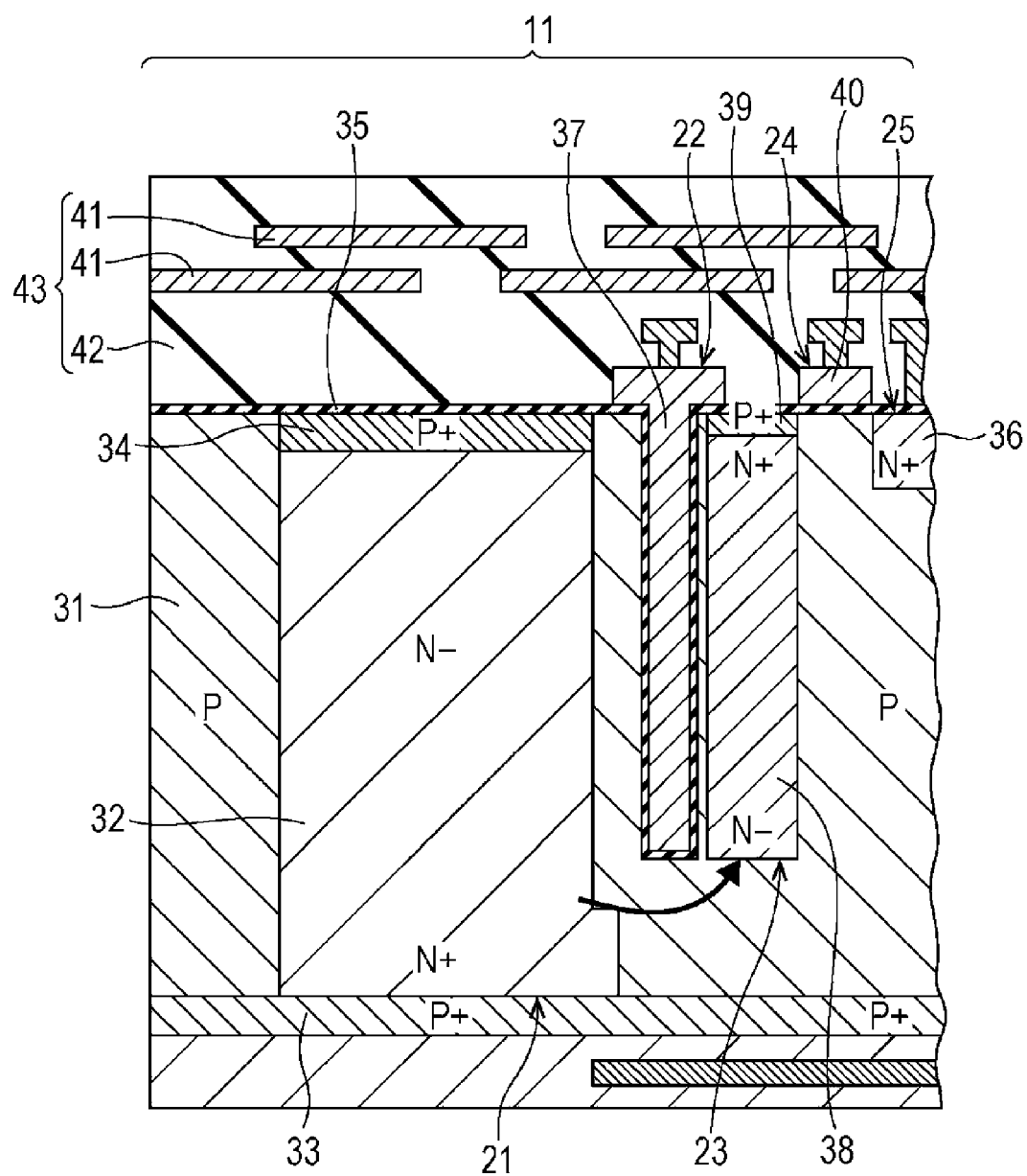
FIG. 5A is a diagram describing a transfer channel of a first transfer transistor.
Figure 5B:
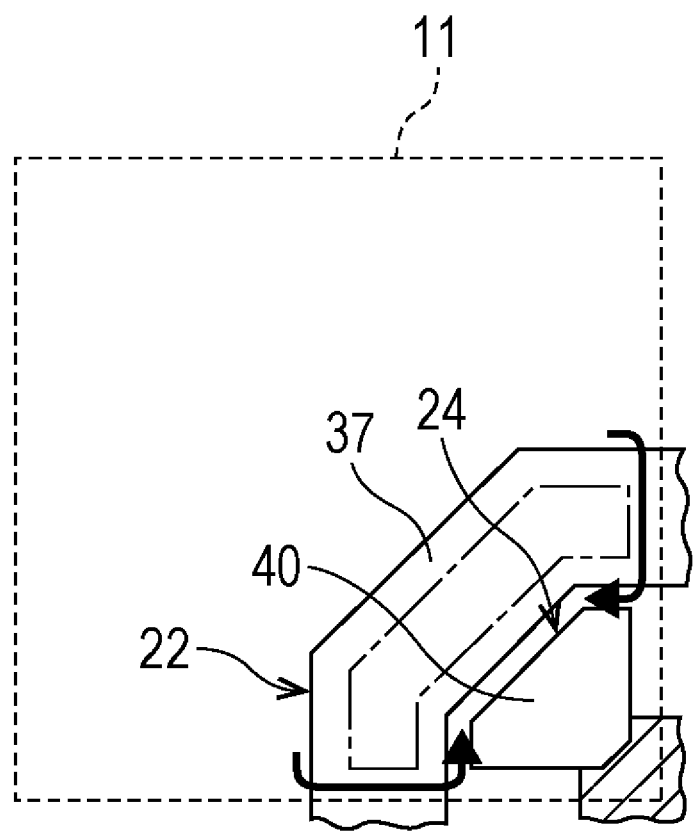
FIG. 5B is a diagram describing the transfer channel of the first transfer transistor.

FIGS. 5A and 5B are diagrams describing a transfer channel of the first transfer transistor 22.

When the first transfer transistor 22 is turned on by the transfer signal TRX, as shown by an arrow of a bold line in FIG. 5A, the charge which is accumulated in the N-type semiconductor region 32 as the photodiode 21, is transferred to the N-type semiconductor region 38 of the memory unit 23 through a bottom portion of the gate electrode 37 of the first transfer transistor 22. Furthermore, as shown in FIG. 5B, some of the charge is also transferred to the N-type semiconductor region 38 from a side of the gate electrode 37. However, the primary transfer channel of the charge is the bottom potion of the gate electrode 37.

FIG. 6A is a diagram illustrating the potential of the N-type semiconductor region 32 which is the charge accumulation region of the photodiode 21 in the depth direction of the substrate.

Within the N-type semiconductor region 32 which is the charge accumulation region of the photodiode 21, as described above, the region of the substrate rear surface side is adjusted to the N-type (N+) semiconductor region having a high concentration, and the region of the substrate surface side is adjusted to the N-type (N−) semiconductor region having a low concentration.

Accordingly, in the photodiode 21, as shown in FIG. 6A, approximately by the substrate rear surface side which is close to the bottom portion of the gate electrode 37 of the first transfer transistor 22, the potential becomes high. Hereby, within the N-type semiconductor region 32, the charge is mainly accumulated in the substrate rear surface side.

By adjusting an impurity concentration of the N-type semiconductor region 32 that forms the charge accumulation region of the photodiode 21 described above, in the pixel 11, the transfer of the charge to the memory unit 23 from the photodiode 21, is easier.

FIG. 6B is a diagram illustrating the potential of the N-type semiconductor region 38 which is the memory unit 23 in the depth direction of the substrate, when the first transfer transistor 22 is turned on.

Within the N-type semiconductor region 38 which is the memory unit 23, as described above, the region of the substrate rear surface side is adjusted to the N-type (N−) semiconductor region having a low concentration, and the region of the substrate surface side is adjusted to the N-type (N+) semiconductor region having a high concentration.

Therefore, in the memory unit 23, as shown in FIG. 6B, approximately by the substrate surface side which is close to the N-type (N+) semiconductor region 36 having a high concentration as the FD 25, the potential becomes high. Hereby, within the N-type semiconductor region 38, the charge is mainly accumulated in the substrate surface side.

By adjusting the impurity concentration of the N-type semiconductor region 38 that forms the charge accumulation region of the memory unit 23 described above, in the pixel 11, the transfer of the charge to the FD 25 from the memory unit 23, is easier.

As described above, in the pixel 11, the configuration that can achieve the refinement thereof and facilitate the transfer of the charge by adjusting the impurity concentration of the charge accumulation region, is adopted.

<6. Method for Manufacturing a Pixel>

Next, referring to FIG. 7 to FIG. 13, a method for manufacturing the pixel 11 of the solid state imaging device 1, will be described.

First, as shown in FIG. 7, into the region of the predetermined depth in an N-type (N−) silicon layer 71A having a low concentration on a SOI (Silicon On Insulator) substrate 71 which is a thin film, for example, a P-type ion such as boron (B) is injected, and thereby a P-type (P+) semiconductor region 33 having a high concentration, is formed.

Furthermore, as shown in FIG. 7, into a predetermined region of the N-type silicon layer 71A, for example, an N-type ion such as phosphorus (P) and arsenic (As) is injected, and thereby an N-type (N+) semiconductor region 32A having a high concentration is formed, within the N-type semiconductor region 32 which is the charge accumulation region of the photodiode 21.

Thereafter, as shown in FIG. 8, on the SOI substrate 71, an N-type silicon layer 72 is formed by epitaxial growth. Moreover, instead of the process which is described with reference to FIG. 7 and FIG. 8, into the silicon substrate of a thick film, the ion is injected at high acceleration energy, and thereby it is possible to form the structure which is similar to FIG. 8.

Figure 9:
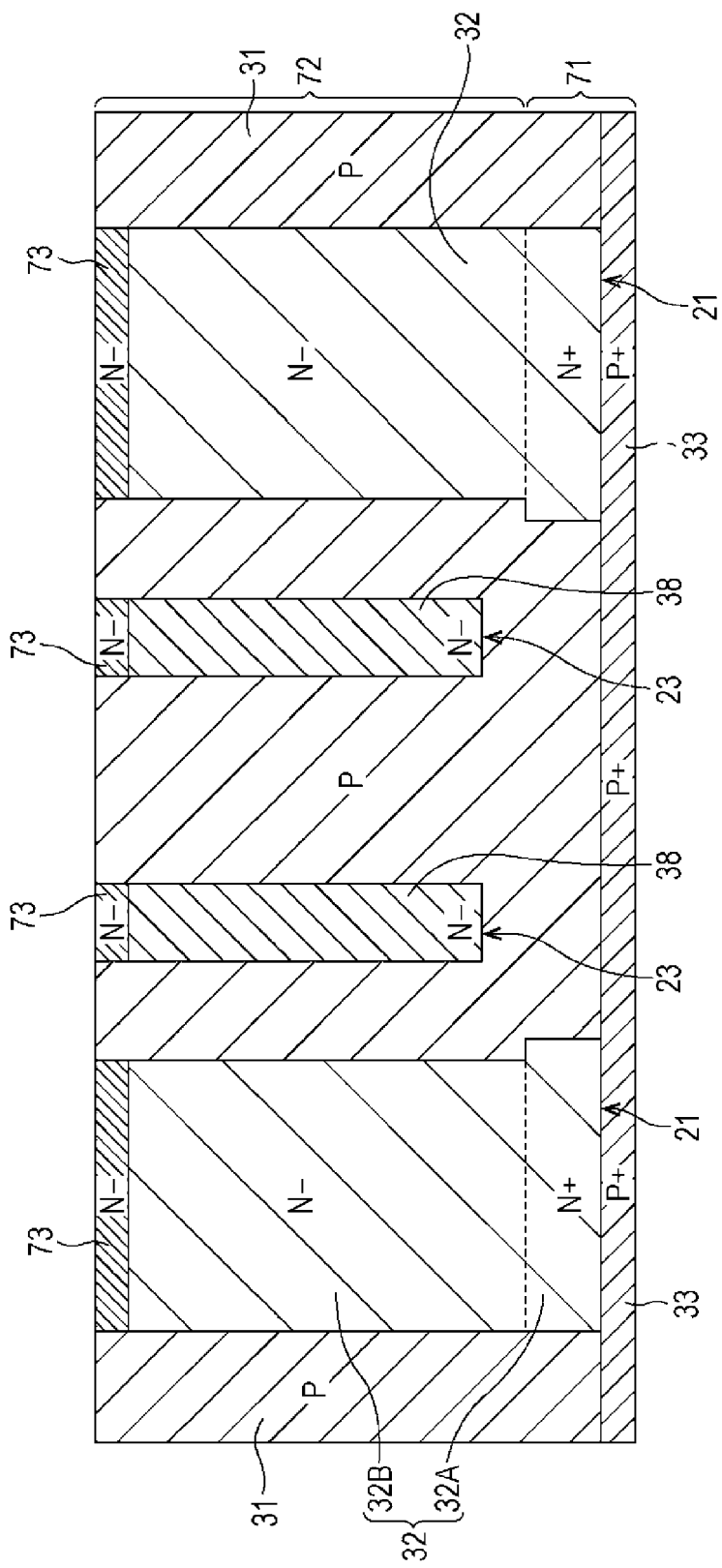
FIG. 9 is a diagram describing the method for manufacturing a pixel.

Next, as shown in FIG. 9, into an upper portion of the N-type (N+) semiconductor region 32A having a high concentration of the N-type silicon layer 72 which is formed by the epitaxial growth, the N-type ion is injected, and thereby an N-type (N−) semiconductor region 32B having a low concentration on the substrate surface side of the photodiode 21, is formed. Hereby, the semiconductor region 32 of the photodiode 21 which is made up of the N-type (N+) semiconductor region 32A having a high concentration and the N-type (N−) semiconductor region 32B having a low concentration, is completed. Moreover, since the N-type ion is further injected into the semiconductor region 32B with respect to the N-type silicon layer 72, the N-type impurity concentration of the semiconductor region 32B is higher than that of the N-type silicon layer 72.

Moreover, at the same time as the formation of the N-type semiconductor region 32B, the N-type ion is injected into the predetermined region of the N-type silicon layer 72, and thereby the N-type semiconductor region 38 which is the memory unit 23, is also formed.

Furthermore, into the region between the N-type semiconductor region 32 of the photodiode 21 of the N-type silicon layer 72 and the N-type semiconductor region 38 of the memory unit 23, and into the region between the N-type semiconductor regions 38 which are adjacent thereto, the P-type ion is injected, and thereby the P-type semiconductor region 31 is formed. As a result, only the upper portion of the N-type semiconductor region 32B of the photodiode 21, and only the upper portion of the N-type semiconductor region 38 of the memory unit 23, become an N-type semiconductor region 73 which is formed by the epitaxial growth.

Figure 10:
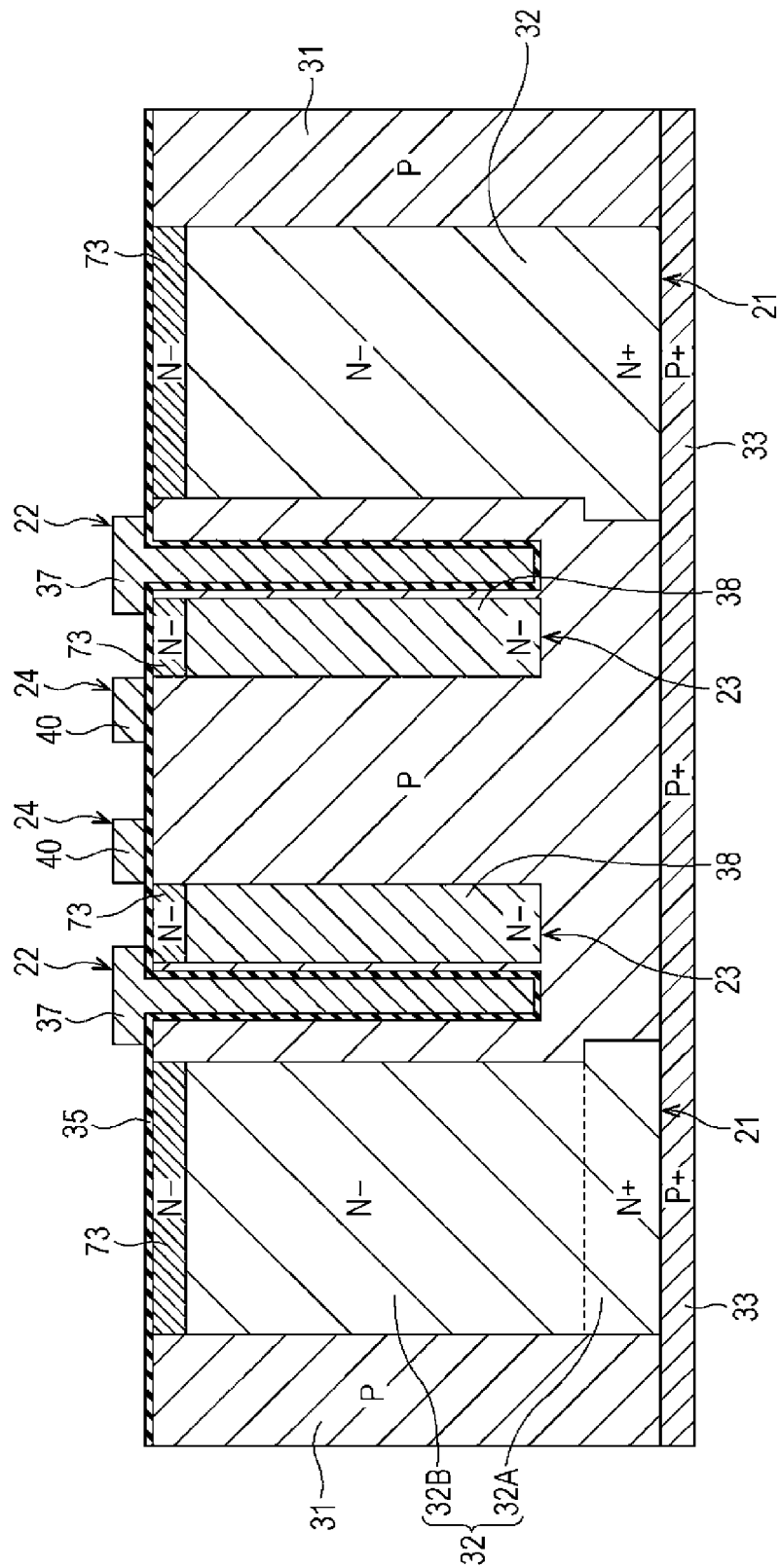
FIG. 10 is a diagram describing the method for manufacturing a pixel.

Next, as shown in FIG. 10, the predetermined region of the P-type semiconductor region 31 between the semiconductor region 32 of the photodiode 21, and the semiconductor regions 38 of the memory unit 23, are dug up to the depth which is almost the same as the semiconductor region 38 of the memory unit 23, from the substrate surface side. Therefore, after the gate insulating film 35 is formed on the entire surface of the substrate surface side, the gate electrode 37 of the first transfer transistor 22, and the gate electrode 40 of the second transfer transistor 24 are formed.

Figure 11:
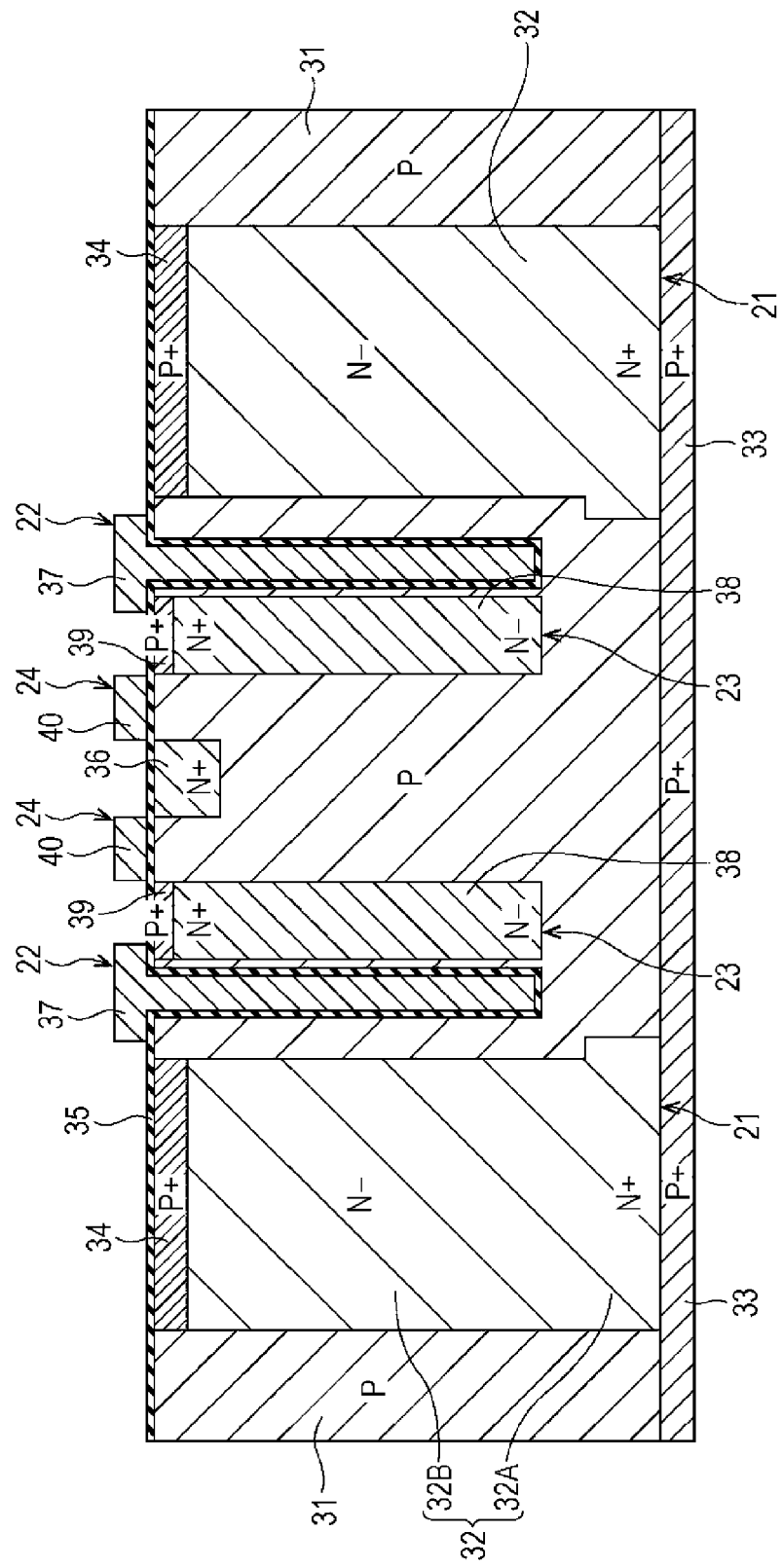
FIG. 11 is a diagram describing the method for manufacturing a pixel.

Next, as shown in FIG. 11, the P-type ion is injected with respect to the semiconductor region 32 of the photodiode 21 and the N-type semiconductor region 73 in the upper portion of the semiconductor region 38 of the memory unit 23, and thereby the P-type (P+) semiconductor regions 34 and 39 having a high concentration, are formed.

Furthermore, the N-type ion is injected with respect to the P-type semiconductor region 31 between the gate electrodes 40 of the two second transfer transistors 24 of the two adjacent pixels, and thereby N-type (N+) semiconductor region 36 having a high concentration as the FD 25 is formed. In the process, the N-type (N+) semiconductor region 52 for discharging the charge in FIGS. 4A and 4B, is also formed at the same time.

Moreover, at the same time as the N-type ion injection to form the N-type (N+) semiconductor region 36 having a high concentration as the FD 25, the N-type ion is also injected into the upper portion of the semiconductor region 38 of the memory unit 23, and with respect to the semiconductor region 38, a concentration difference which varies in the depth direction is formed.

Furthermore, the process of the N-type ion injection and the P-type ion injection which is described with reference to FIG. 11, may be performed before forming the gate insulating film 35, the gate electrode 37 of the first transfer transistor 22, and the gate electrode 40 of the second transfer transistor 24 as described with reference to FIG. 10.

Figure 12:
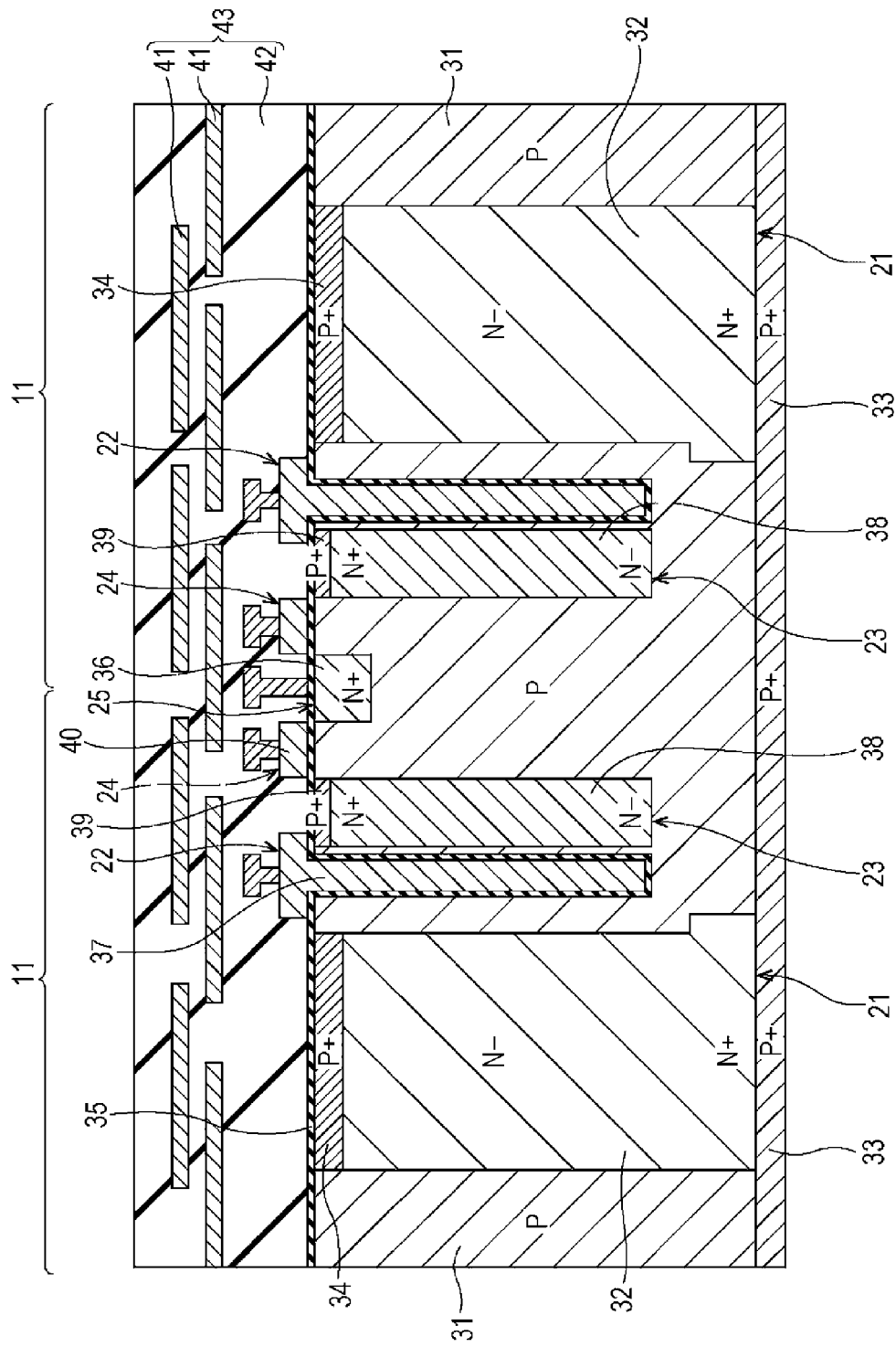
FIG. 12 is a diagram describing the method for manufacturing a pixel.
Figure 13:
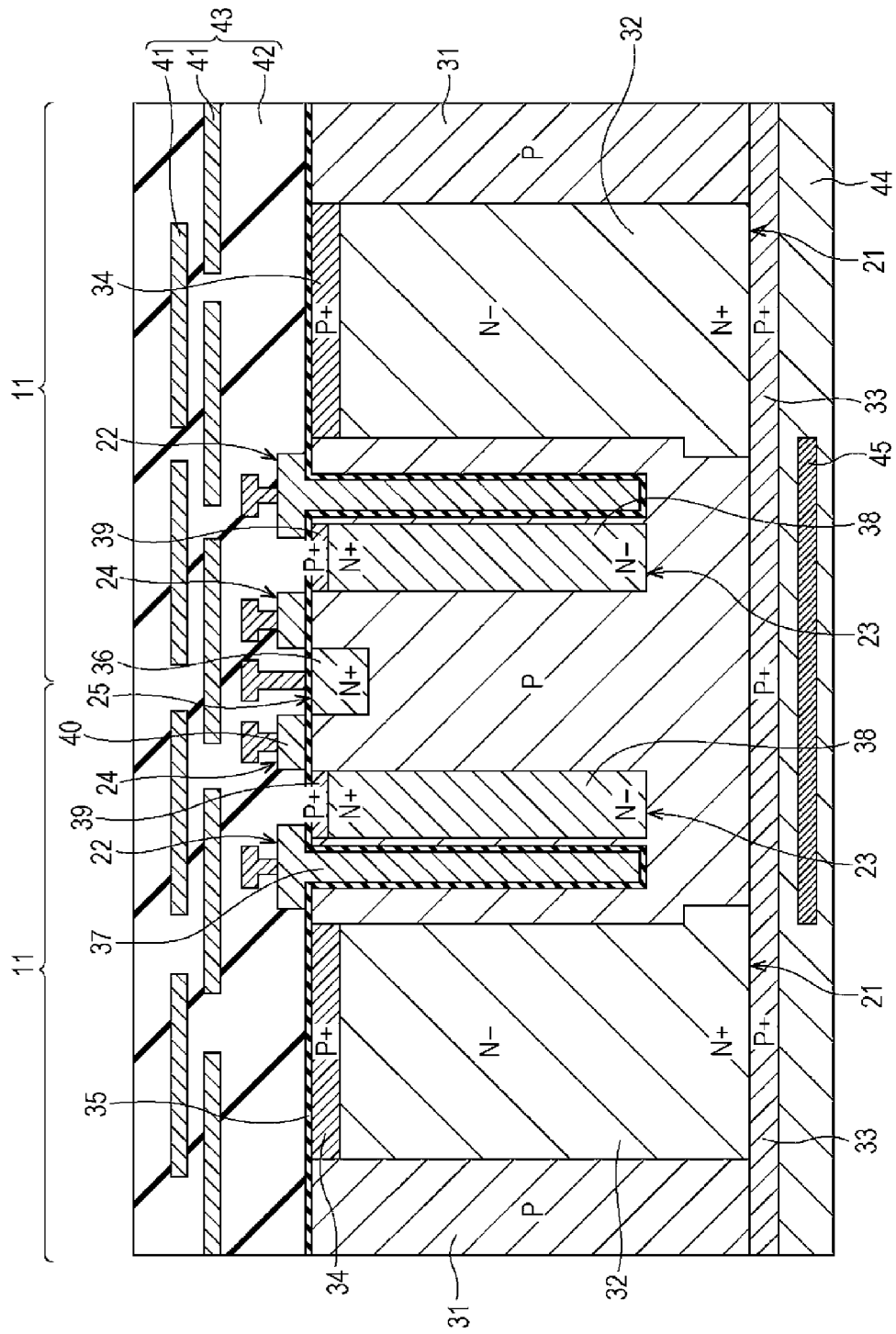
FIG. 13 is a diagram describing the method for manufacturing a pixel.

Next, as shown in FIG. 12, the multilayer wiring layer 43 which is made up of the plurality of the wiring layer 41 and the interlayer insulating film 42, are formed. Therefore, as shown in FIG. 13, after the flattening film 44 and the light shielding film 45 are formed on the substrate rear surface side, the color filter and the on-chip lens which are not shown in the drawing, are formed on the further lower side (light incidence side) of the flattening film 44.

In the manner described above, it is possible to manufacture the pixel 11 of the solid state imaging device 1.

<7. Pixel Structure According to a Second Embodiment>

Next, the pixel 11 according to a second embodiment will be described.

Figure 14:
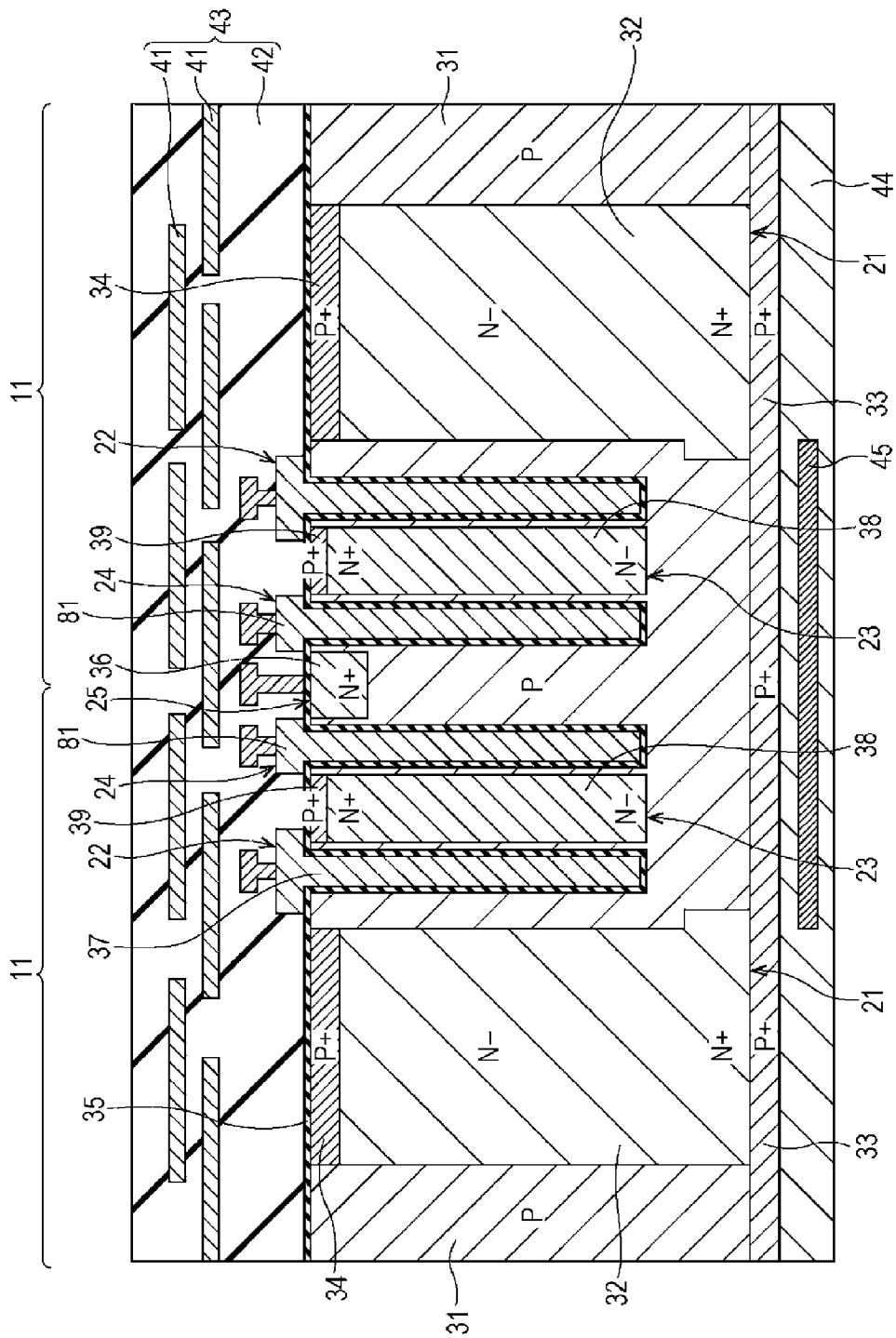
FIG. 14 is a cross-sectional view illustrating a pixel structure according to a second embodiment of the pixel.

FIG. 14 is a cross-sectional view illustrating the pixel structure according to the second embodiment of the pixel 11.

In FIG. 14, the same reference signs are attached to the portions corresponding to the first embodiment shown in FIG. 3, and the descriptions thereof are appropriately omitted.

In the second embodiment of FIG. 14, a point that the second transfer transistor 24 is not the flat surface type and is formed in the longitudinal type in the same manner as the first transfer transistor 22, is different from the first embodiment. That is, in FIG. 14, a gate electrode 81 of the second transfer transistor 24 is formed up to the depth which is almost the same as the N-type semiconductor region 38 of the memory unit 23, from the interface of the substrate surface side.

Therefore, both of the first transfer transistor 22 and the second transfer transistor 24 can be formed in the longitudinal type transistor which is dug up to the depth which is almost the same as the memory unit 23 including the gate electrode of the longitudinally long shape.

<8. Pixel Structure According to a Third Embodiment>

Next, the pixel 11 according to a third embodiment will be described.

Figure 15:
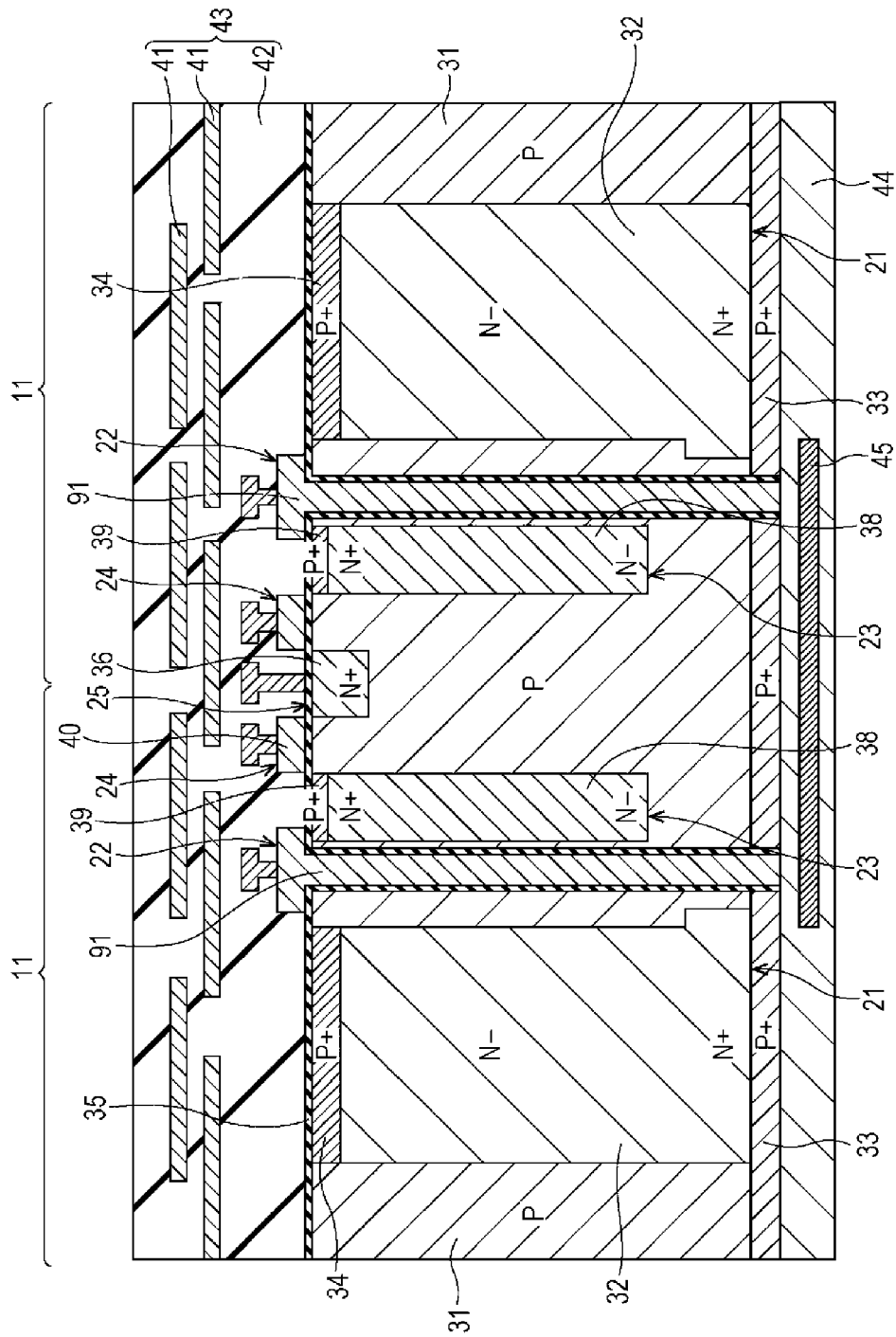
FIG. 15 is a cross-sectional view illustrating a pixel structure according to a third embodiment of the pixel.

FIG. 15 is a cross-sectional view illustrating the pixel structure according to the third embodiment of the pixel 11.

Furthermore, also in FIG. 15, the same reference signs are attached to the portions corresponding to the first embodiment shown in FIG. 3, and the descriptions thereof are appropriately omitted.

In the third embodiment of FIG. 15, the point that a gate electrode 91 of the first transfer transistor 22 is not formed up to the depth which is almost the same as the N-type semiconductor region 38 of the memory unit 23 and passes through the P-type semiconductor region 31, is different from the first embodiment. In this case, the transfer channel of the charge to the memory unit 23 from the photodiode 21 is only the side wall of the first transfer transistor 22 shown in FIG. 5B.

<9. Pixel Structure According to a Fourth Embodiment>

Next, the pixel 11 according to a fourth embodiment will be described.

Figure 16:
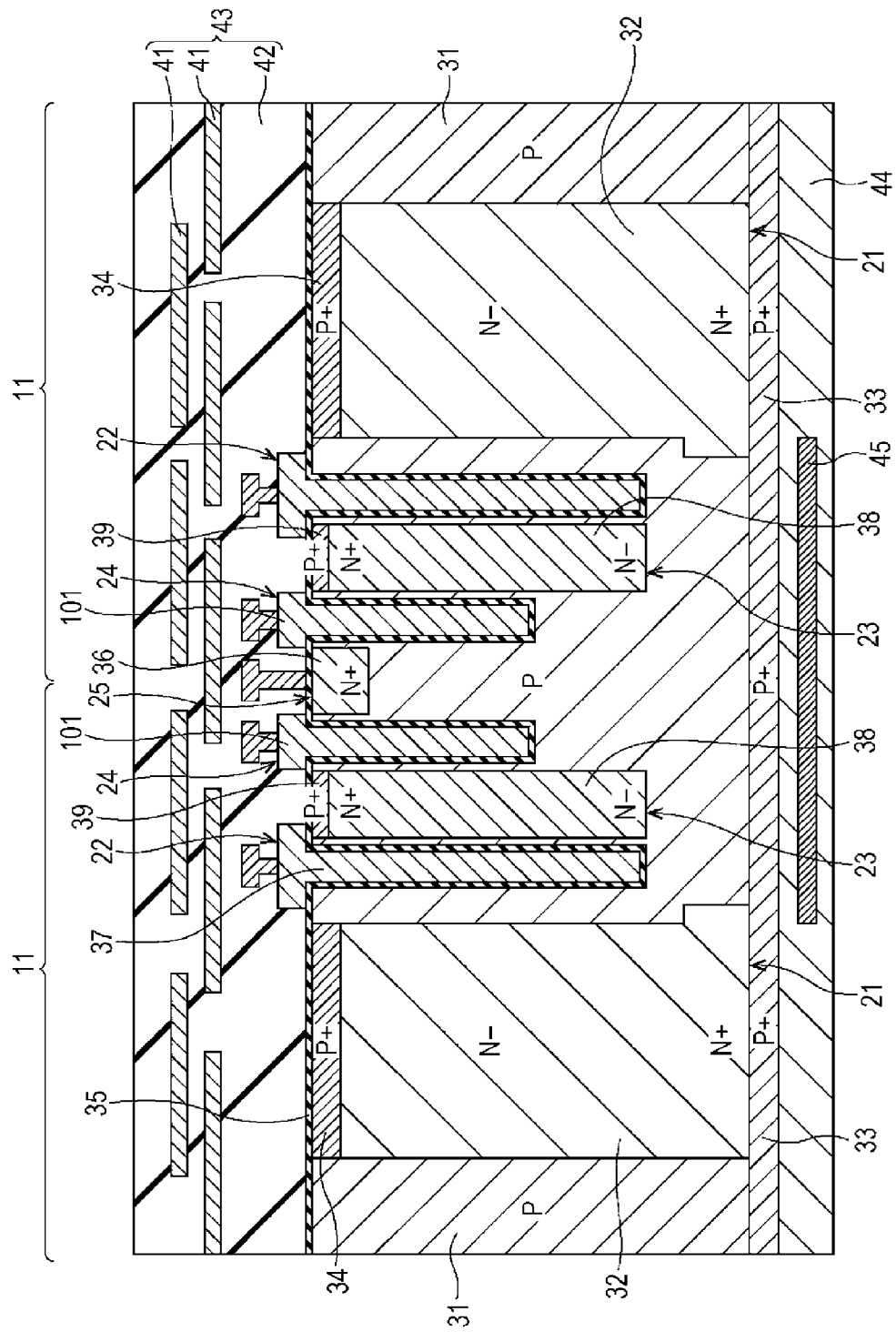
FIG. 16 is a cross-sectional view illustrating a pixel structure according to a fourth embodiment of the pixel.

FIG. 16 is a cross-sectional view illustrating the pixel structure according to the fourth embodiment of the pixel 11.

Moreover, also in FIG. 16, the same reference signs are attached to the portions corresponding to the first embodiment shown in FIG. 3, and the descriptions thereof are appropriately omitted.

In the fourth embodiment of FIG. 16, the point that the second transfer transistor 24 is not the flat surface type and is formed in the longitudinal type, is different from the first embodiment. Furthermore, the point that a gate electrode 101 of the second transfer transistor 24 is not formed up to the depth which is almost the same as the N-type semiconductor region 38 which is the memory unit 23 and is formed up to the depth in the middle of the N-type semiconductor region 38, is different from the second embodiment of FIG. 14.

In other words, in the fourth embodiment, the depth in the gate electrode 37 of the first transfer transistor 22 which is the longitudinal type transistor, is different from the depth in the gate electrode 101 of the second transfer transistor 24. The depth in the gate electrode 101 of the second transfer transistor 24 may be good if the depth in the gate electrode 101 of the second transfer transistor 24 is not deeper than the depth in the N-type semiconductor region 38 of the memory unit 23.

Since the first transfer transistor 22 is formed in the longitudinal type according to any one of the second embodiment to the fourth embodiment described above, it is possible to achieve the refinement of the pixel, and to realize the structure which can be also applied to the rear surface irradiation type.

<10. Configuration Example of an Electronic Apparatus to Which the Present Technology is Applied>

The present technology is not limited to an application to the solid state imaging device. That is, the present technology can be generally applied with respect to an electronic apparatus using the solid state imaging device in an image capturing unit (photoelectric conversion unit) such as an imaging apparatus of a digital still camera, a video camera or the like, a mobile terminal apparatus having an imaging function, and a copy machine using the solid state imaging device in an image reading unit. The solid state imaging device may be formed in the form as one chip, and may be formed in the form of a module shape having an imaging function which is packaged with an imaging unit, a signal processing unit or an optical system together.

FIG. 17 is a block diagram illustrating a configuration example of the imaging apparatus as the electronic apparatus to which the present technology is applied.

An imaging apparatus 200 of FIG. 17, includes an optical unit 201 which is made up of a lens group and the like, a solid state imaging device (image pickup device) 202 in which each configuration of the pixel 11 described above is adopted, and a DSP (Digital Signal Processor) circuit 203 which is a camera signal processing circuit. Moreover, the imaging apparatus 200 also includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are connected to each other through a bus line 209.

The optical unit 201 captures the incident light (image light) from a subject, and forms an image on an imaging surface of the solid state imaging device 202. The solid state imaging device 202 converts a light amount of the incident light with which the image is formed on the imaging surface by the optical unit 201, into an electrical signal by a pixel unit, and outputs the converted signal as a pixel signal. As the solid state imaging device 202, the solid state imaging device 1 of FIG. 1 may be used.

For example, the display unit 205 is made up of a panel type display device such as liquid crystal panel and an organic EL (Electro Luminescence) panel, and displays a moving image or a still image of which the image is imaged by the solid state imaging device 202. The recording unit 206 records the moving image or the still image of which the image is imaged by the solid state imaging device 202, on a recording medium such as a hard disk and a semiconductor memory.

Under the operation by a user, the operation unit 207 issues an operation instruction for various functions which are held in the imaging apparatus 200. The power supply unit 208 appropriately supplies various power sources which are operation power supplies of the DSP circuit 203, the frame memory 204, the display unit 205, the recording unit 206, and the operation unit 207, with respect to the supply targets.

Furthermore, the present technology is not limited to the application to the solid state imaging device that detects distribution of the incident light amount of the visible light, and images the distribution thereof as an image. The present technology can be generally applied with respect to the solid state imaging device such as the solid state imaging device imaging the distribution of the incident amount of infrared rays, X-ray, particles or the like as an image, and the solid state imaging device (physical quantity distribution detection device) such as a fingerprint detection sensor which detects the distribution of other physical quantity such as pressure and electrostatic capacity and images the distribution thereof as an image, in a broad sense.

The embodiments of the present technology is not limited to the embodiments described above, if necessary the portions of each configuration of the pixel described above are appropriately combined, or various modifications can be made within the scope without departing from the gist of the present technology.

Moreover, in the examples described above, the pixel structure of the rear surface irradiation type is described, but the present technology can be also applied to the pixel structure of the surface irradiation type.

In the examples described above, the solid state imaging device setting the first conductivity type as P-type, the second conductivity type as N-type, and an electron as signal charge, is described, but the present technology can be also applied to the solid state imaging device setting a positive hole as signal charge. That is, it is possible to configure each semiconductor region described above in the semiconductor region of the reverse conductivity type setting the first conductivity type as N-type and the second conductivity type as P-type.

Furthermore, the present technology can take the following configurations.

(1) A solid state imaging device, comprising: a pixel, including: a photoelectric conversion unit;

a charge accumulation unit that accumulates the charge which is generated by the photoelectric conversion unit;

a first transfer transistor that transfers the charge of the photoelectric conversion unit to the charge accumulation unit;

wherein a gate electrode of the first transfer transistor extends from a first surface of a semiconductor substrate that is opposite from a light receiving surface of the semiconductor substrate to a predetermined first depth within the semiconductor substrate, and wherein the charge accumulation unit extends to a second depth adjacent a side wall of the gate electrode of the first transfer transistor which is buried within the semiconductor substrate.

(2) The solid state imaging device according to the above (1), further comprising: a charge holding unit, wherein the charge holding unit is separated from the charge accumulation unit in a direction parallel to the light receiving surface of the semiconductor substrate.

(3) The solid state imaging device according to the above (1), wherein the charge accumulation unit is formed on a charge holding unit side of the first transfer transistor, and wherein the photoelectric conversion unit is on an opposite side of the first transfer transistor.

(4) The solid state imaging device according to the above (1), wherein the charge accumulation unit is adjusted so as to make a potential of a light incident side of the charge accumulation unit low, when the first transfer transistor is turned on.

(5) The solid state imaging device according to the above (1), wherein the photoelectric conversion unit is adjusted so as to make a potential of a light incident side high.

(6) The solid state imaging device according to the above (1), further comprising: a charge holding unit; and a light shielding film on a light incident side of the charge accumulation unit and the charge holding unit.

(7) The solid state imaging device according to the above (1), wherein a transfer channel of the first transfer transistor is formed in a vicinity of a side wall of the gate electrode.

(8) The solid state imaging device according to the above (1), wherein a transfer channel of the first transfer transistor is formed in a vicinity of a bottom portion of the gate electrode.

(9) The solid state imaging device according to the above (1), wherein the gate electrode of the first transfer transistor is formed of a material having a light shielding capability.

(10) The solid state imaging device according to the above (1), further comprising: a charge holding unit that holds the charge in order to read out the charge as a signal; and
a second transfer transistor that transfers the charge of the charge accumulation unit to the charge holding unit.

(11) The solid state imaging device according to the above (10), wherein a gate electrode of the second transfer transistor is formed to be buried in a depth direction of the semiconductor substrate.

(12) The solid state imaging device according to the above (11), wherein a depth of the gate electrode of the second transfer transistor is the same as a depth of the gate electrode of the first transfer transistor.

(13) The solid state imaging device according to the above (11), wherein a depth of the gate electrode of the second transfer transistor is shallower than a depth of the gate electrode of the first transfer transistor.

(14) The solid state imaging device according to the above (10), wherein the gate electrode of the first transfer transistor passes through the semiconductor substrate.

(15) The solid state imaging device according to the above (14), wherein a gate electrode of the second transfer transistor is formed to be buried in a depth direction of the semiconductor substrate, and wherein a depth of the gate electrode of the second transfer transistor is shallower than a depth of the gate electrode of the first transfer transistor.

(16) The solid state imaging device according to the above (1), wherein the charge accumulation unit is smaller than the photoelectric conversion unit in a dimension parallel to a light incident side of the semiconductor substrate.

(17) The solid state imaging device according to the above (1), wherein the charge holding unit is configured so as to be shared with other pixels which are adjacent to the pixel.

(18) The solid state imaging device of the above (1), wherein the first depth of the gate electrode of the first transfer transistor is the same as the second depth of the charge accumulation unit.

(19) A method for manufacturing a solid state imaging device, comprising: forming a pixel including a photoelectric conversion unit that generates a charge according to an amount of light which is received;
forming a charge accumulation unit that accumulates the charge which is generated by the photoelectric conversion unit;
forming a first transfer transistor that transfers the charge of the photoelectric conversion unit to the charge accumulation unit;
forming a gate electrode of the first transfer transistor, wherein the gate electrode of the first transfer transistor extends from a first surface of a semiconductor substrate that is opposite from a light receiving surface of the semiconductor substrate to a predetermined first depth within the semiconductor substrate, and
wherein the charge accumulation unit extends to a second depth adjacent a side wall of the gate electrode of the first transfer transistor which is buried within the semiconductor substrate.

(20) The method of the above (19), further comprising: forming a charge holding unit that holds the charge in order to read out the charge as a signal, and a second transfer transistor that transfers the charge of the charge accumulation unit to the charge holding unit.

(21) An electronic apparatus, comprising: a solid state imaging device,
wherein the solid state imaging device includes a pixel including: a photoelectric conversion unit;
a charge accumulation unit that accumulates the charge which is generated by the photoelectric conversion unit,
a first transfer transistor that transfers the charge of the photoelectric conversion unit to the charge accumulation unit,
wherein a gate electrode of the first transfer transistor extends from a first surface of a semiconductor substrate that is opposite from a light receiving surface of the semiconductor substrate to a predetermined first depth within the semiconductor substrate, and
wherein the charge accumulation unit extends to a second depth adjacent a side wall of the gate electrode of the first transfer transistor which is buried within the semiconductor substrate.

(22) The electronic apparatus of the above (21), further comprising: a charge holding unit that holds the charge in order to read out the charge as a signal, and
a second transfer transistor that transfers the charge of the charge accumulation unit to the charge holding unit.

(23) The electronic apparatus of the above (21), wherein the first depth of the gate electrode of the first transfer transistor is the same as the second depth of the charge accumulation unit.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Solid state imaging device
4 Pixel array unit
21 Photodiode
22 First transfer transistor
23 Memory unit (MEM)
24 Second transfer transistor
25 FD (floating diffusion)
200 Imaging apparatus
202 Solid state imaging device

The invention claimed is:
1. A solid state imaging device, comprising:
a pixel, including:
a photoelectric conversion unit;
a charge accumulation unit that accumulates the charge which is generated by the photoelectric conversion unit;
a first transfer transistor that transfers the charge of the photoelectric conversion unit to the charge accumulation unit,
wherein a gate electrode of the first transfer transistor extends from a first surface of a semiconductor substrate that is opposite from a light receiving surface of the semiconductor substrate to a predetermined first depth within the semiconductor substrate, wherein the gate electrode of the first transfer transistor is between the photoelectric conversion unit and the charge accumulation unit, wherein the charge accumulation unit extends to a second depth adjacent a side wall of the gate electrode of the first transfer transistor which is buried within the semiconductor substrate, and wherein the charge accumulation unit is smaller than the photoelectric conversion unit in a dimension parallel to a light incident side of the semiconductor substrate, wherein a first portion of the charge accumulation unit that is closest to the light receiving surface includes a first impurity type material, wherein a second portion of the charge accumulation unit that is furthest from the light receiving surface includes a second impurity type material, and wherein a third portion of the charge accumulation unit between the first portion and the second portion includes the first impurity type material having a higher concentration of impurities than the first portion.

2. The solid state imaging device according to claim 1, further comprising:
a charge holding unit between the gate electrode and another gate electrode of an adjacent pixel, wherein the charge holding unit is separated from the charge accumulation unit in a direction parallel to the light receiving surface of the semiconductor substrate.

3. The solid state imaging device according to claim 2, wherein the charge accumulation unit is formed on a same side of the first transfer transistor as the charge holding unit, and wherein the photoelectric conversion unit is on an opposite side of the first transfer transistor.

4. The solid state imaging device according to claim 1, wherein the charge accumulation unit is adjusted so as to make a potential of a light incident side of the charge accumulation unit low, when the first transfer transistor is turned on.

5. The solid state imaging device according to claim 1, wherein the photoelectric conversion unit is adjusted so as to make a potential of a light incident side high.

6. The solid state imaging device according to claim 1, further comprising:
a charge holding unit; and
a light shielding film on a light incident side of the charge accumulation unit and the charge holding unit.

7. The solid state imaging device according to claim 1, wherein a transfer channel of the first transfer transistor is formed in a vicinity of a side wall of the gate electrode.

8. The solid state imaging device according to claim 1, wherein a transfer channel of the first transfer transistor is formed in a vicinity of a bottom portion of the gate electrode.

9. The solid state imaging device according to claim 1, wherein the gate electrode of the first transfer transistor is formed of a material having a light shielding capability.

10. The solid state imaging device according to claim 1, further comprising:
a charge holding unit that holds the charge in order to read out the charge as a signal; and
a second transfer transistor that transfers the charge of the charge accumulation unit to the charge holding unit.

11. The solid state imaging device according to claim 10, wherein a gate electrode of the second transfer transistor is formed to be buried in a depth direction of the semiconductor substrate.

12. The solid state imaging device according to claim 11, wherein a depth of the gate electrode of the second transfer transistor is the same as a depth of the gate electrode of the first transfer transistor.

13. The solid state imaging device according to claim 11, wherein a depth of the gate electrode of the second transfer transistor is shallower than a depth of the gate electrode of the first transfer transistor.

14. The solid state imaging device according to claim 10, wherein the gate electrode of the first transfer transistor passes through the semiconductor substrate.

15. The solid state imaging device according to claim 14, wherein a gate electrode of the second transfer transistor is formed to be buried in a depth direction of the semiconductor substrate, and wherein a depth of the gate electrode of the second transfer transistor is shallower than a depth of the gate electrode of the first transfer transistor.

16. The solid state imaging device according to claim 1, wherein the charge holding unit is configured so as to be shared with other pixels which are adjacent to the pixel.

17. The solid state imaging device of claim 1, wherein the first depth of the gate electrode of the first transfer transistor is the same as the second depth of the charge accumulation unit.

18. A method for manufacturing a solid state imaging device, comprising:
forming a pixel including a photoelectric conversion unit that generates a charge according to an amount of light which is received;
forming a charge accumulation unit that accumulates the charge which is generated by the photoelectric conversion unit;
forming a first transfer transistor that transfers the charge of the photoelectric conversion unit to the charge accumulation unit;
forming a gate electrode of the first transfer transistor,
wherein the gate electrode of the first transfer transistor extends from a first surface of a semiconductor substrate that is opposite from a light receiving surface of the semiconductor substrate to a predetermined first depth within the semiconductor substrate,
wherein the gate electrode of the first transfer transistor is between the photoelectric conversion unit and the charge accumulation unit,
wherein the charge accumulation unit extends to a second depth adjacent a side wall of the gate electrode of the first transfer transistor which is buried within the semiconductor substrate,
wherein the first depth of the gate electrode of the first transfer transistor is the same as the second depth of the charge accumulation unit,
wherein the charge accumulation unit is smaller than the photoelectric conversion unit in a dimension parallel to a light incident side of the semiconductor substrate, wherein a first portion of the charge accumulation unit that is closest to the light receiving surface includes a first impurity type material, wherein a second portion of the charge accumulation unit that is furthest from the light receiving surface includes a second impurity type material, and wherein a third portion of the charge accumulation unit between the first portion and the second portion includes the first impurity type material having a higher concentration of impurities than the first portion.

19. The method of claim 18, further comprising:
forming a charge holding unit that holds the charge in order to read out the charge as a signal, and a second transfer transistor that transfers the charge of the charge accumulation unit to the charge holding unit.

20. An electronic apparatus, comprising:
a solid state imaging device,
wherein the solid state imaging device includes a pixel including:
a photoelectric conversion unit;
a charge accumulation unit that accumulates the charge which is generated by the photoelectric conversion unit;
a first transfer transistor that transfers the charge of the photoelectric conversion unit to the charge accumulation unit,
wherein a gate electrode of the first transfer transistor extends from a first surface of a semiconductor substrate that is opposite from a light receiving surface of the semiconductor substrate to a predetermined first depth within the semiconductor substrate,
wherein the gate electrode of the first transfer transistor is between the photoelectric conversion unit and the charge accumulation unit,
wherein the charge accumulation unit extends to a second depth adjacent a side wall of the gate electrode of the first transfer transistor which is buried within the semiconductor substrate,
wherein the first depth of the gate electrode of the first transfer transistor is the same as the second depth of the charge accumulation unit, and
wherein the charge accumulation unit is smaller than the photoelectric conversion unit in a dimension parallel to a light incident side of the semiconductor substrate, wherein a first portion of the charge accumulation unit that is closest to the light receiving surface includes a first impurity type material, wherein a second portion of the charge accumulation unit that is furthest from the light receiving surface includes a second impurity type material, and wherein a third portion of the charge accumulation unit between the first portion and the second portion includes the first impurity type material having a higher concentration of impurities than the first portion.

21. The electronic apparatus of claim 20, further comprising:
a charge holding unit that holds the charge in order to read out the charge as a signal, and
a second transfer transistor that transfers the charge of the charge accumulation unit to the charge holding unit.

22. The electronic apparatus of claim 20, wherein a portion of the gate electrode and a portion of the charge accumulation unit that are closest to the light receiving surface are embedded in a same material of the semiconductor substrate.

* * * * *